United States Patent
Shi et al.

(10) Patent No.: US 6,329,086 B1
(45) Date of Patent: Dec. 11, 2001

(54) ELECTROLUMINESCENT DEVICES HAVING ARYLAMINE POLYMERS

(75) Inventors: Jianmin Shi, Webster; Shiying Zheng, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/593,127

(22) Filed: Jun. 13, 2000

(51) Int. Cl.[7] .................................................. H05B 33/14
(52) U.S. Cl. .......................... 428/690; 428/917; 428/704; 313/504; 313/506; 252/301.16; 252/301.35; 257/40; 257/103
(58) Field of Search ..................................... 428/690, 917, 428/704; 313/504, 506; 252/301.35, 301.16; 257/40, 103

(56) References Cited

U.S. PATENT DOCUMENTS

| | | |
|---|---|---|
| 4,356,429 | 10/1982 | Tang . |
| 4,769,292 | 9/1988 | Tang et al. . |
| 5,429,884 | 7/1995 | Namiki et al. . |
| 5,776,622 | 7/1998 | Hung et al. . |
| 5,904,990 * | 5/1999 | Stenger-Smith et al. ............ 428/457 |
| 5,935,721 | 8/1999 | Shi et al. . |
| 5,972,247 | 10/1999 | Shi et al. . |

OTHER PUBLICATIONS

Son, Luminescence Enhancement by the Introduction of Disorder into Poly(p–phenylene vinylene), Science, vol. 269, Jul. 21, 1995, pp. 376–378.
Stenger–Smith et al, Synthesis and Characterization of Poly(2,5–bis(N–methyl–N–hexylamino)phenylene vinylene), a Conjugated Polymer for Light–Emitting Diodes, Macromolecules, 1998, 31, 7566–7569.
Grem et al, Realization of a Blue–Light–Emitting Device using Poly(p–phenylene), Advanced Materials, 1992, No. 1, pp. 36–37.
Ohmori et al, Blue Electroluminescent Diodes Utilizing Poly(alkylfluorene), Japanese Journal of Applied Physics, vol. 30, No. 11B, Nov. 1991, pp. L–1941–1943.
Burroughes et alk, Light–Emitting diodes basedon conjugated polymers, Nature, vol. 347, Oct. 11, 1990, pp. 539–541.

* cited by examiner

*Primary Examiner*—Cynthia H. Kelly
*Assistant Examiner*—Ling Xu
(74) *Attorney, Agent, or Firm*—Raymond L. Owens

(57) ABSTRACT

An electroluminescent device which includes an anode, a cathode, and a polymer luminescent material disposed between the anode and cathode, the polymer luminescent material having arylamine moiety has the molecular formula:

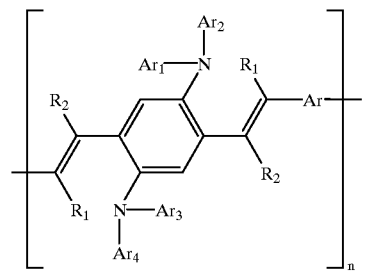

wherein:
$R_1$ and $R_2$ are independently hydrogen, alkyl group of from 1 to 24 carbon atoms, or aryl or substituted aryl of from 6 to 40 carbon atoms, or heteroaryl or substituted heteroaryl of from 4 to 40 carbons, or a cyano group;

$Ar_1$, $Ar_2$, $Ar_3$, $Ar_4$, and Ar are each individually aryl or substituted aryl of from 6 to 40 carbon atom; or a heteroaryl or substituted heteroaryl of from 4 to 40 carbons, or combinations thereof.

6 Claims, 4 Drawing Sheets

| 4000 |
|------|
| 3000 |
| 2000 |
| 1000 |

FIG 3

ELECTROLUMINESCENT DEVICES HAVING ARYLAMINE POLYMERS

FIELD OF THE INVENTION

The present invention relates to electroluminescent (EL) devices having arylamine polymers.

BACKGROUND OF THE INVENTION

Electroluminescent (EL) devices such as light emitting diode (LED) are opto-electronic devices which radiate light on the application of an electrical field. Organic materials including both polymers and small molecules have been used to fabricate LEDs. LEDs fabricated from these materials offer several advantages over other technologies, such as simpler manufacturing, low operating voltages, and the possibility of producing large area and full-color displays. Organic polymers generally offer significant processing advantages over small molecules especially for large area EL display because polymer films can be easily produced by casting from solutions.

Conjugated polymers such as poly(phenylvinylene) (PPV) were first introduced as EL materials by Burroughes et al in 1990 (Burroughes, J. H. Nature 1990, 347, 539–41). Other conjugated polymers include polydialkylfluorene (PF) (Ohmori, Y. et al Jpn. J. Appl. Phys. Part 2 1991, 20, L1941–L1943), poly(p-phenylene) (PPP) (Grem, G. et al Adv. Mater. 1992, 4, 36–7), and poly(thiophene). However, PPVs and their derivatives are among the most studied conjugated polymers because of their great potential applications in various areas including LED, photodiodes, organic transistors, and solid state laser materials. Electron donor such as alkoxy substituted PPVs show higher efficiencies than unsubstituted ones in LED applications. Amine groups are stronger electron donors than alkoxy groups, and amino-substituted PPVs have also been prepared to investigate the effect of amino groups on the LED efficiencies. However, only dialkylamines have been incorporated into PPV as substitutents (Stenger-Smith, J. D. et al Macromolecules 1998, 31, 7566–7569). It is known that dialkylamino groups are susceptible to oxidation.

SUMMARY OF THE INVENTION

It is an object of the present invention to provide luminescent polymeric materials useful for polymer EL devices.

It is a further object of the present invention to provide various energy bandgap luminescent polymers which emit broad range of color.

These objects are achieved in an electroluminescent device which comprises an anode, a cathode, and a polymer luminescent material disposed between the anode and cathode, the polymeric luminescent material having aryl amine moiety has the molecular formula:

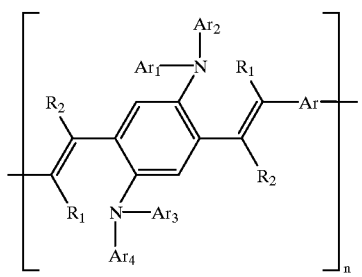

wherein:
$R_1$ and $R_2$ are independently hydrogen, alkyl group of from 1 to 24 carbon atoms, or aryl or substituted aryl of from 6 to 40 carbon atoms, or heteroaryl or substituted heteroaryl of from 4 to 40 carbons, or a cyano group;
$Ar_1$, $Ar_2$, Ar3, Ar4, and Ar are each individually aryl or substituted aryl of from 6 to 40 carbon atoms; or a heteroaryl or substituted heteroaryl of from 4 to 40 carbons, or combinations thereof.

The present invention provides light-emitting materials with a number of advantages that include good solubility, efficiency and stability. The emitting color of the polymer can be easily tuned by the incorporation of desired Ar group. Furthermore, other electro-optical properties can also be tuned with Ar group.

BRIEF DESCRIPTION OF THE DRAWINGS

FIG. 3 illustrates a cross-section of a single-layer EL device which can use a polymer in accordance with the present invention;

DETAILED DESCRIPTION OF THE INVENTION

Figure 1:
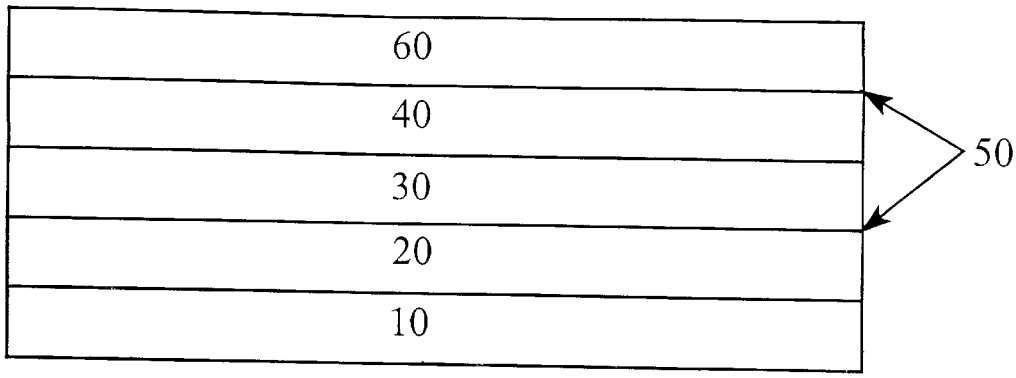
FIG. 1 illustrates in cross-section a bi-layer EL device which can use a polymer in accordance with the present invention.

The present invention provides light-emitting polymers containing arylamine moieties with good solubility, efficiency and stability. Arylamine as a hole transport material in organic light-emitting devices was studied intensively due to its high hole transporting mobility, chemical and electronic stability. Arylamine moieties are strong electron donors that will improve the hole injection and transporting mobility of light-emitting polymer. Moreover, incorporating arylamine moieties into light-emitting polymer can enhance the solubility, improve polymer conductivity, and adjust polymer oxidation sensitivity. Incorporation of Ar in the light-emitting polymer have the following features:

1) to improve EL efficiency by achieving good balanced electron-hole injection and recombination of the charge carriers;
2) to further improve solubility of the polymer; and
3) to tune the emissive color of the polymer.

The present invention provides light-emitting polymers containing arylamine moieties having following molecular formulae:

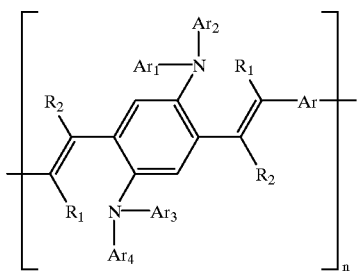

wherein:

R$_1$ and R$_2$ are independently hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group. Preferably, R$_1$ and R$_2$ are hydrogen, or a cyano group.

Ar$_1$, Ar$_2$, Ar$_3$, Ar$_4$, and Ar are each individually aryl or substituted aryl of from 6 to 40 carbon atoms; or Ar$_1$, Ar$_2$, Ar$_3$, Ar$_4$, and Ar are each individually substituted heteroaryl or unsubstituted heteroaryl having 4 to 40 carbons;

For example, Ar$_1$, Ar$_2$, Ar$_3$, and Ar$_4$ represent

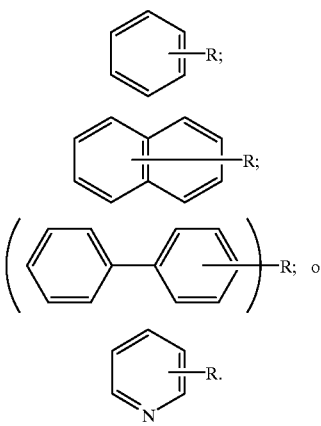

wherein: R is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom;

Or Ar$_1$ and Ar$_2$, Ar$_3$ and Ar$_4$ can be connected through a chemical bond, and Ar$_1$ and Ar$_2$ together, Ar$_3$ and Ar$_4$ together can contain 12 to 40 carbon atoms. For example, Ar$_1$ and Ar$_2$, are connected by a chemical bond to form a first group and Ar$_3$ and Ar$_4$ are connected by a chemical bond to form a second group and wherein the first and second groups are respectively given by the following formulas:

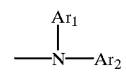

and

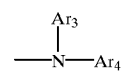

include following carbazole and carbazole derivatives:

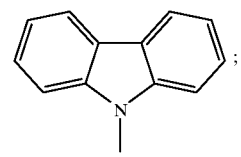

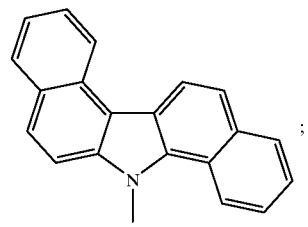

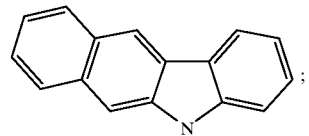

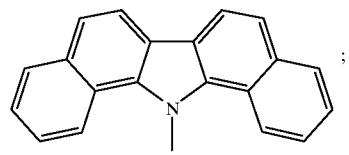

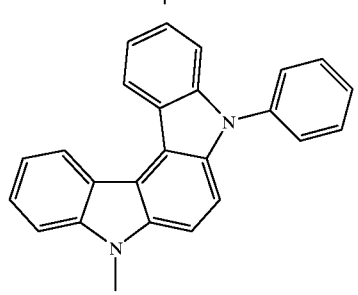

Ar represents the following groups:

Group 1:

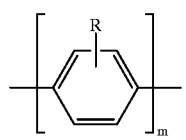

wherein: R is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons, or a cyano group, a nitro group, a chlorine, bromine, or a fluorine atom; and m is an integer from 1 to 3;

In the following Groups 2–24 R is the same substituent as for Group 1.

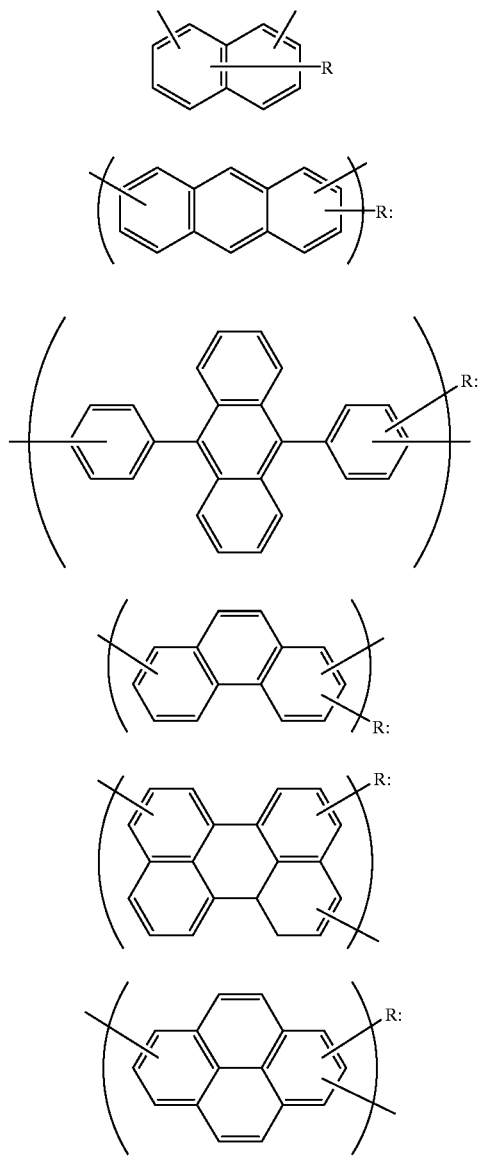

Group 2

Group 3

Group 4

Group 5

Group 6

Group 7

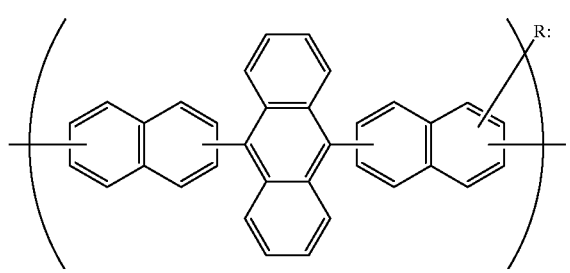

Group 8

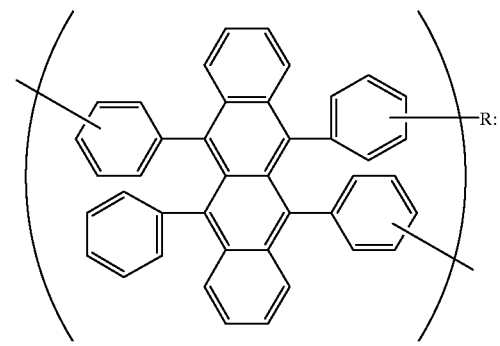

Group 9

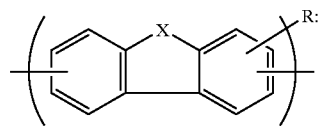

Group 10 wherein: X is an O or S atom;

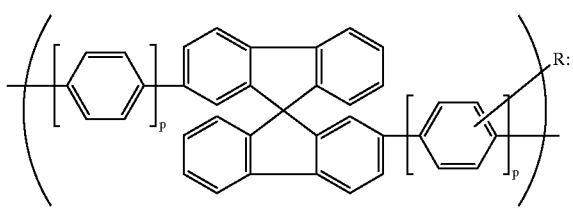

Group 11 wherein: p is an integer from 0 to 2;

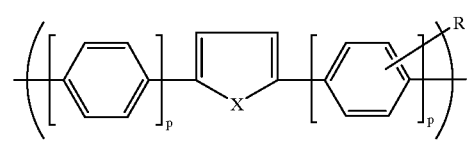

Group 12 wherein: X is an O or S atom, and p is an integer from 0 to 2;

Group 13

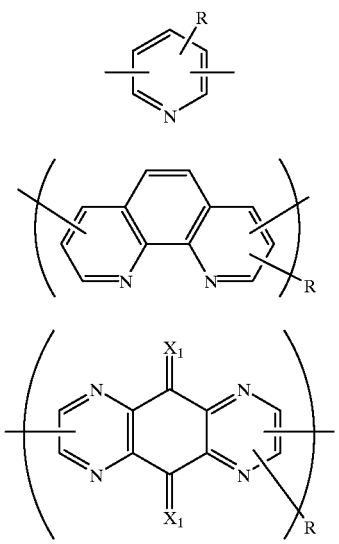

Group 14

Group 15 wherein: X₁ is an O atom or two cyano groups;

Group 16

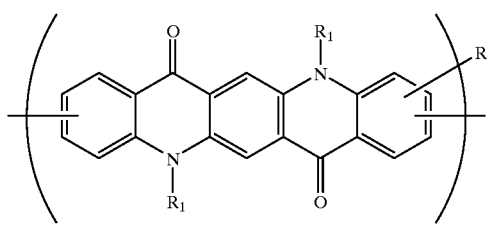

wherein: R₁ is a substituent, and can be hydrogen, alkyl group of from 1 to 24 carbon atoms, or aryl or substituted aryl of from 6 to 28 carbon atoms, or heteroaryl or substituted heteroaryl of from 4 to 40 carbons;

Group 17

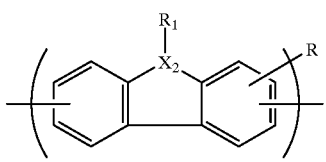

wherein: R₁ is defined as above, and X₂ is a nitrogen or carbon atom;

Group 18

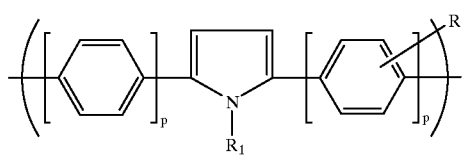

wherein: R₁ is defined as above, and p is an integer from 0 to 2.

Group 19

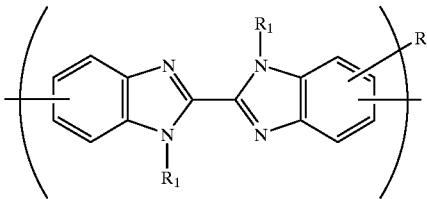

Group 20

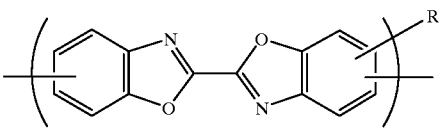

Group 21

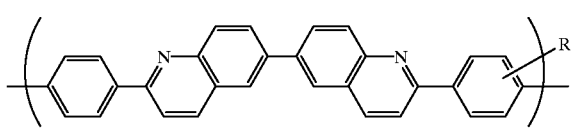

Group 22

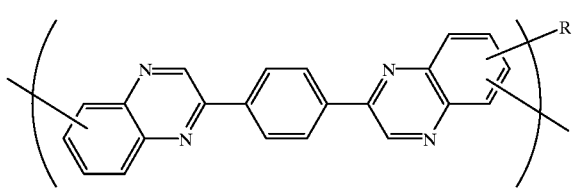

Group 23

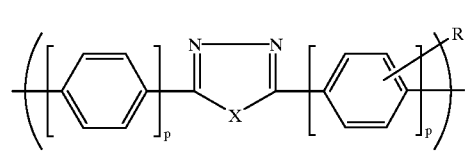

wherein: X is an O or S atom, p is an integer from 0 to 2;

Group 24

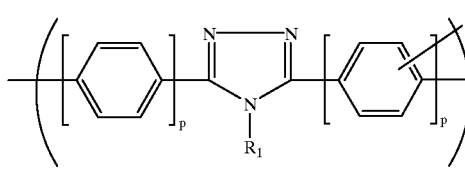

wherein: R₁ is defined as above, and p is an integer from 0 to 2.

The following molecular structures constitute specific examples of preferred polymers satisfying the requirement of this invention:

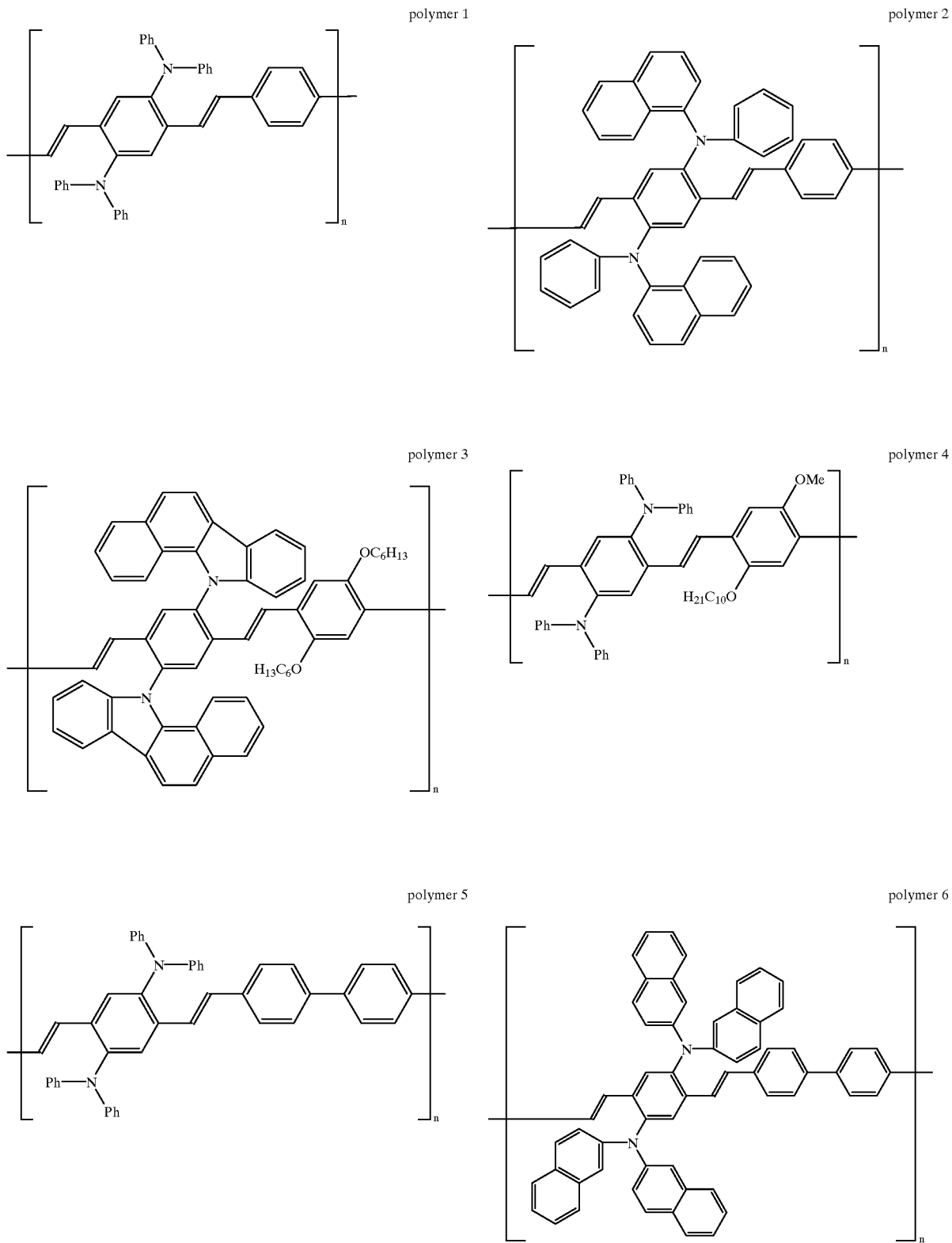

-continued
polymer 7
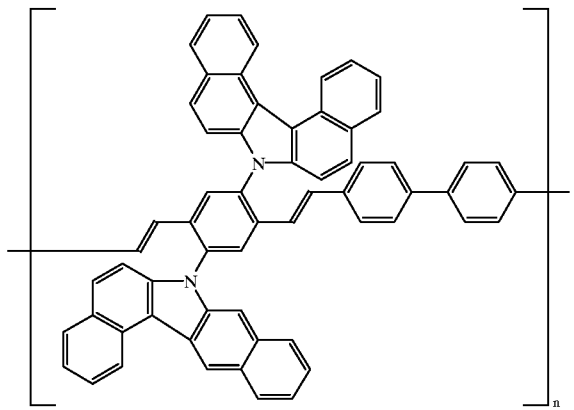
polymer 8
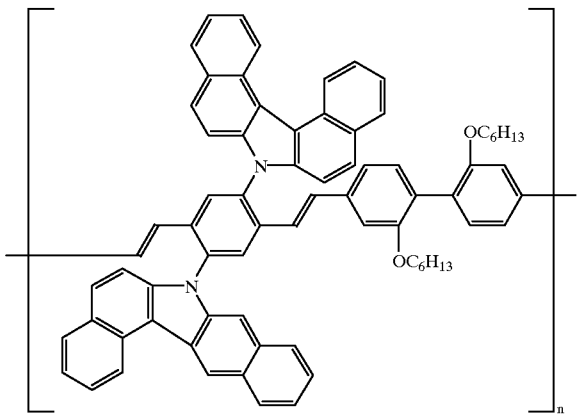
polymer 9
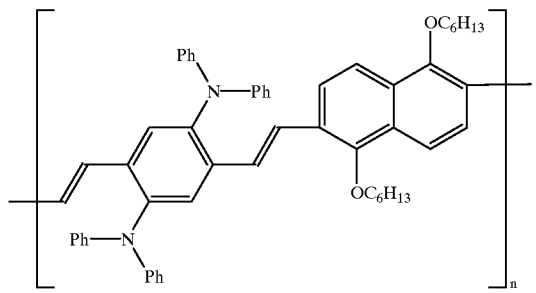
polymer 10
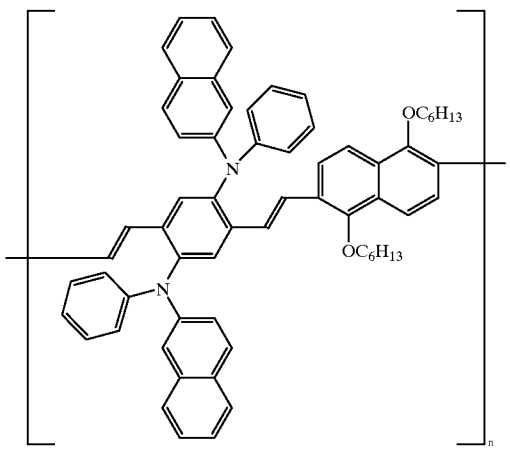
polymer 11
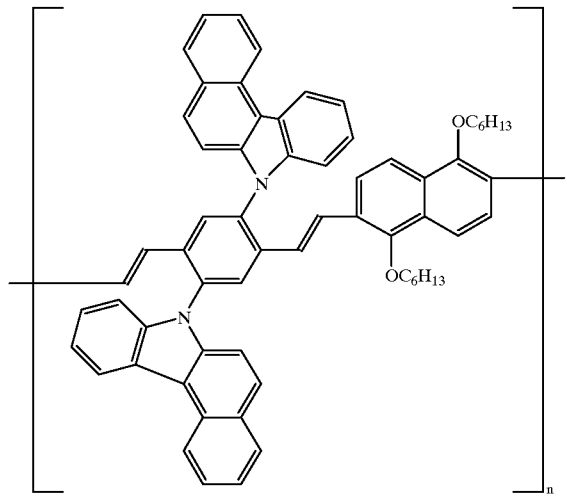
polymer 12
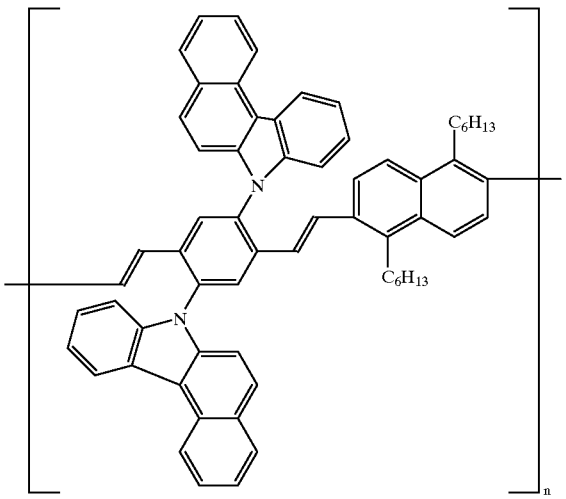

-continued
polymer 13
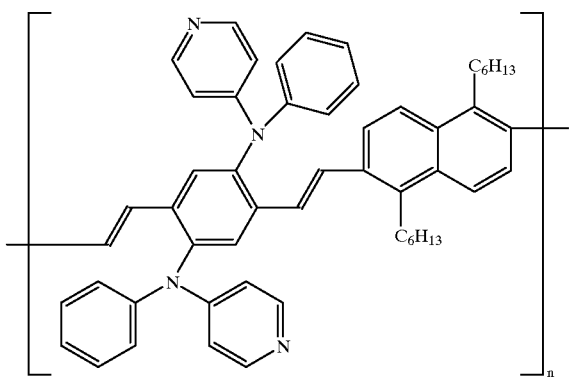
polymer 14
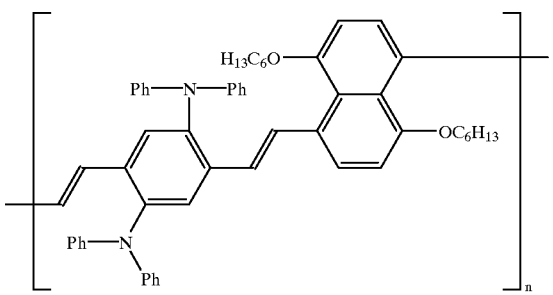
polymer 15
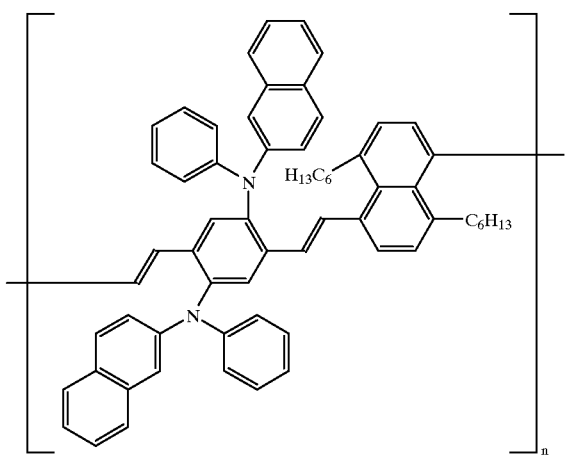
polymer 16
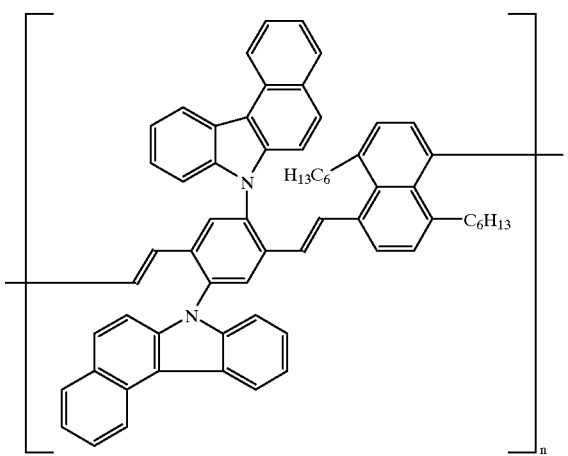
polymer 17
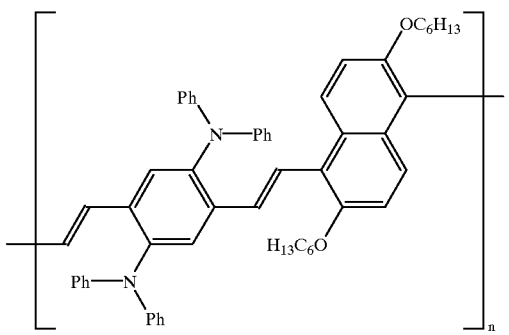
polymer 18
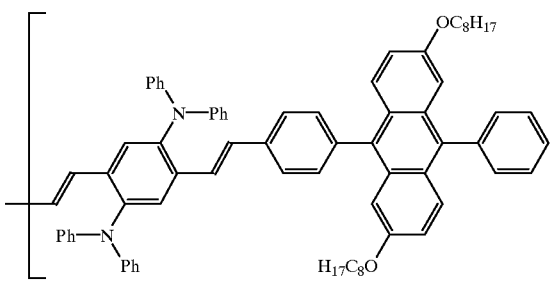
polymer 19
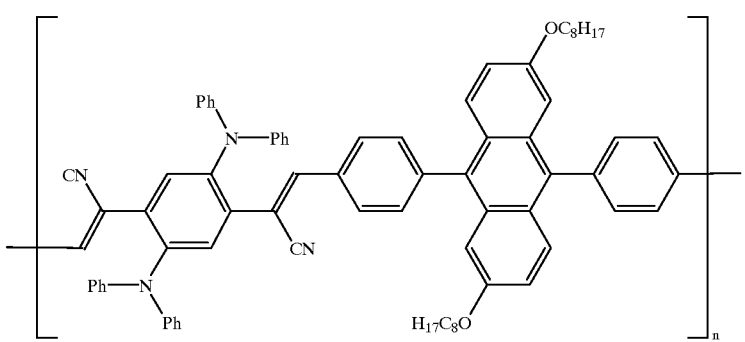

-continued
polymer 20
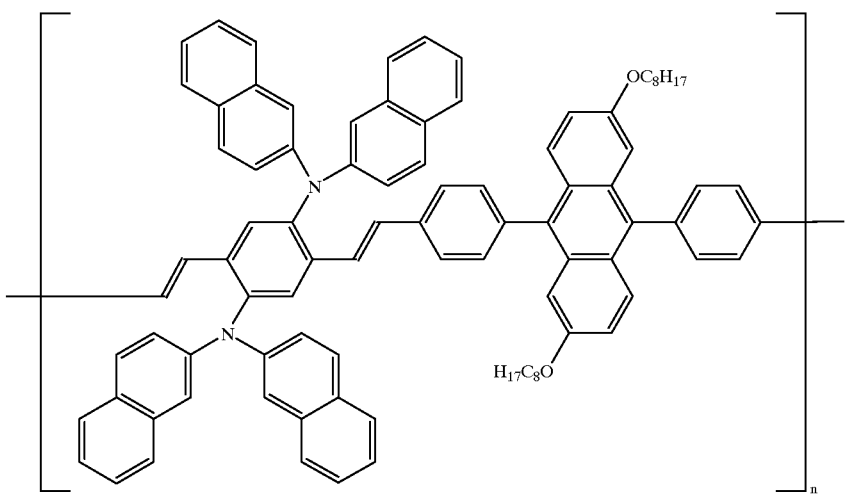
polymer 21
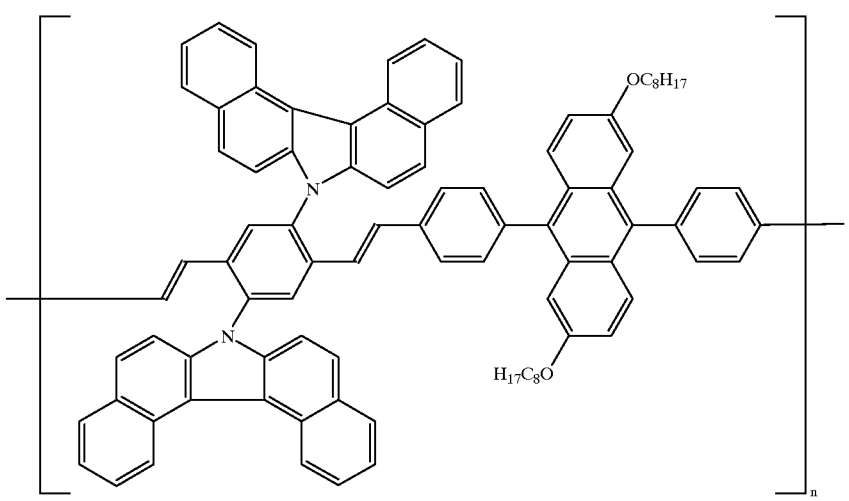
polymer 22
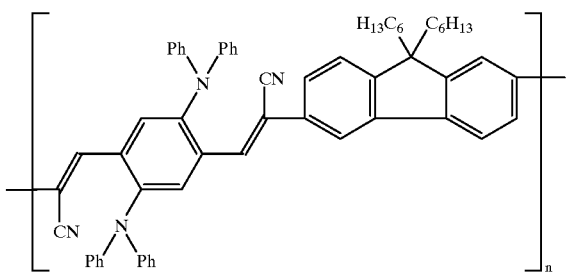
polymer 23
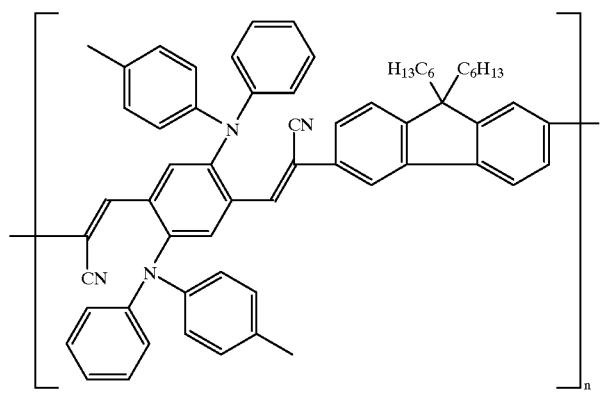

polymer 24
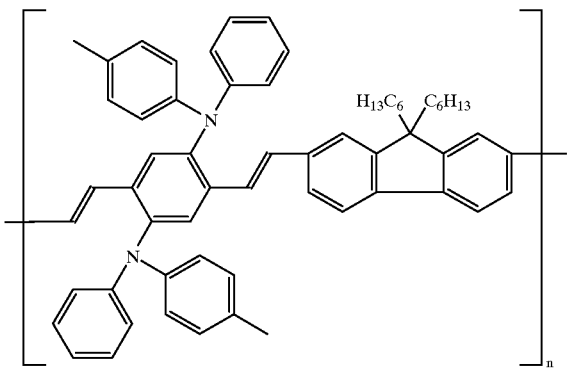
polymer 25
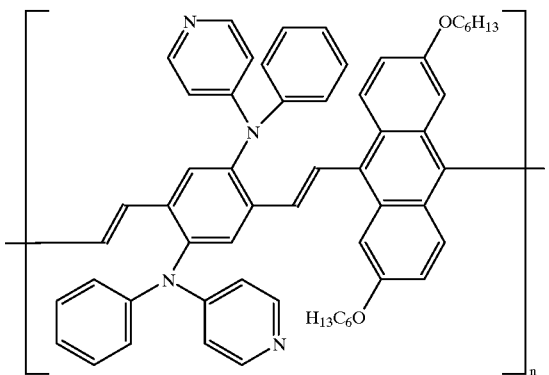
polymer 26
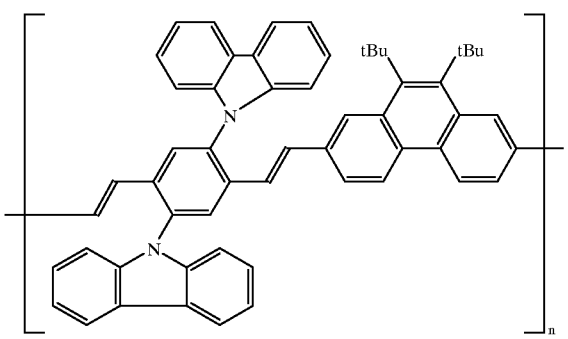
polymer 27
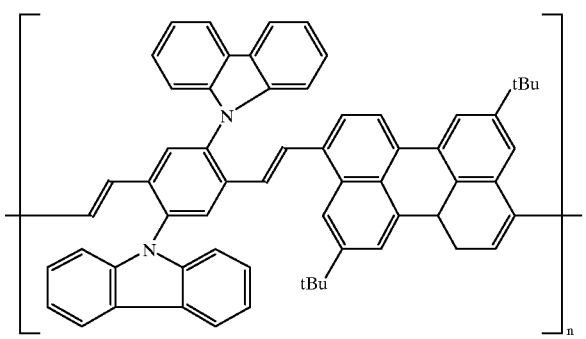
polymer 29
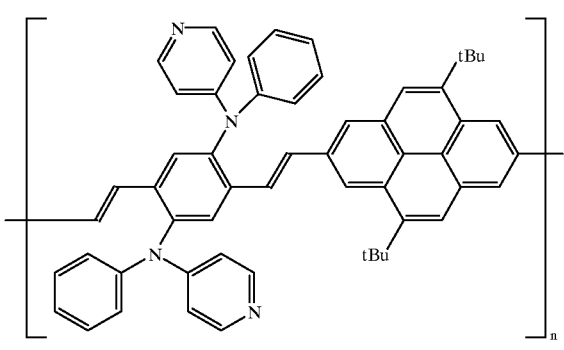
polymer 30
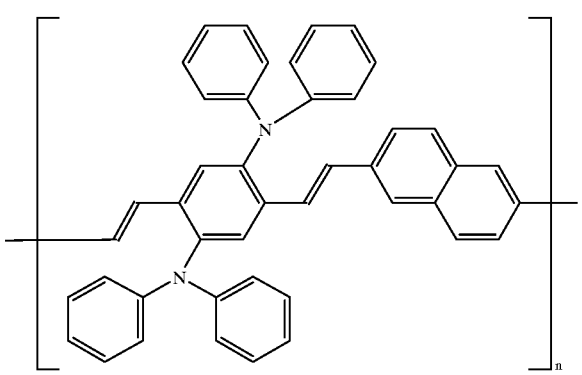
polymer 31
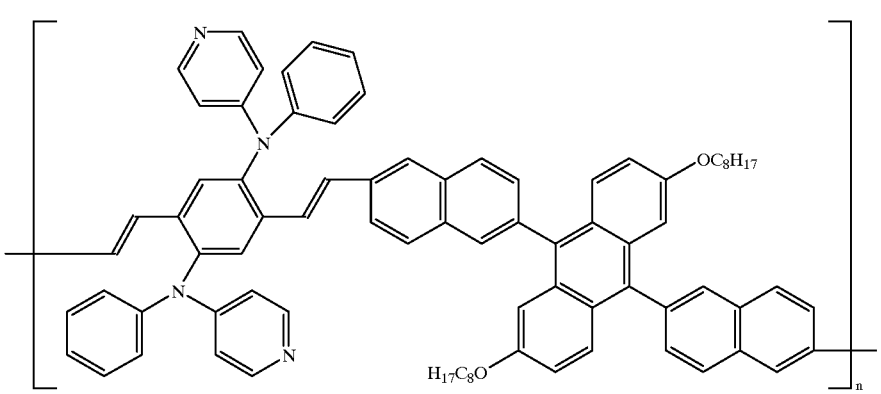

polymer 32
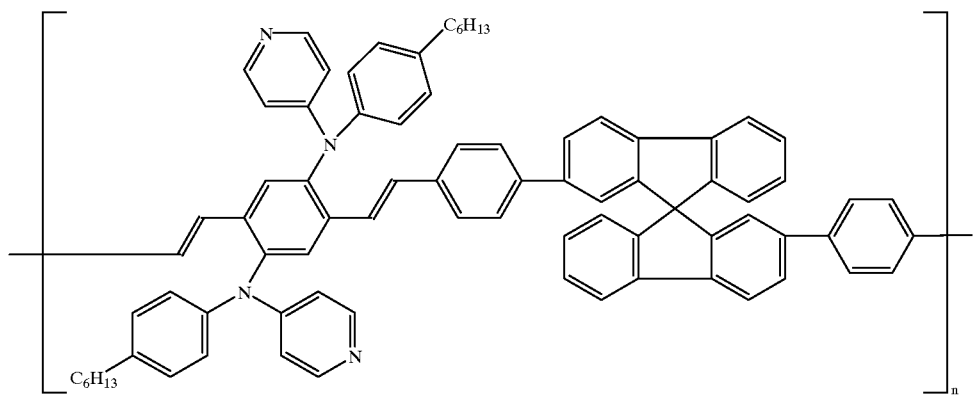
polymer 33
polymer 34
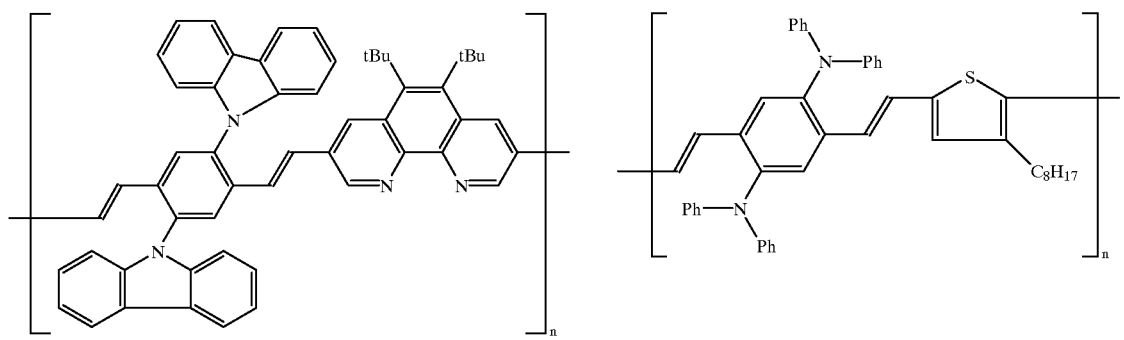
polymer 35
polymer 36
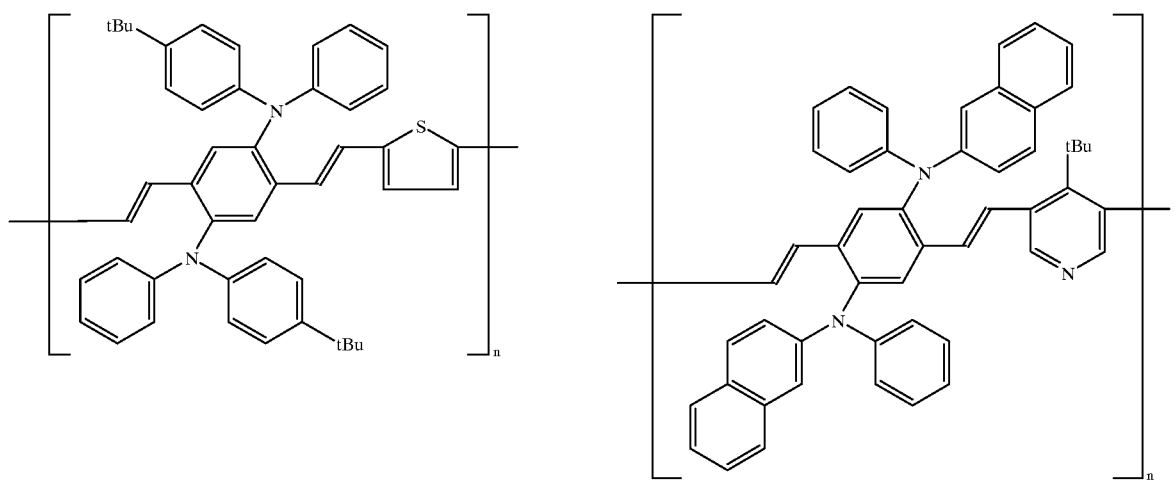

-continued
polymer 37
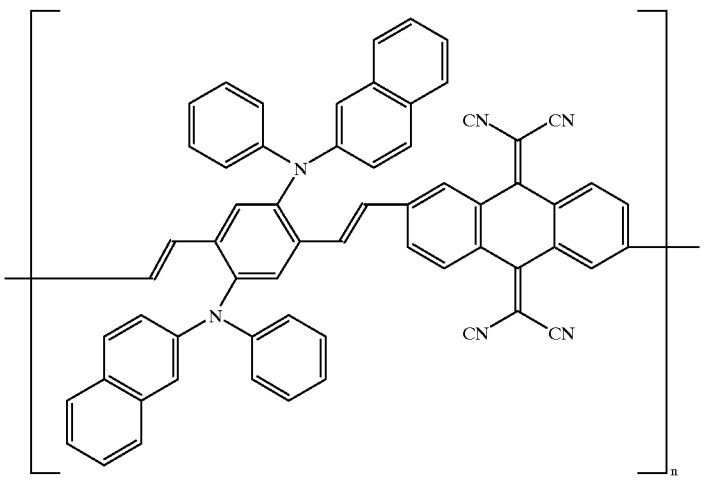
polymer 38
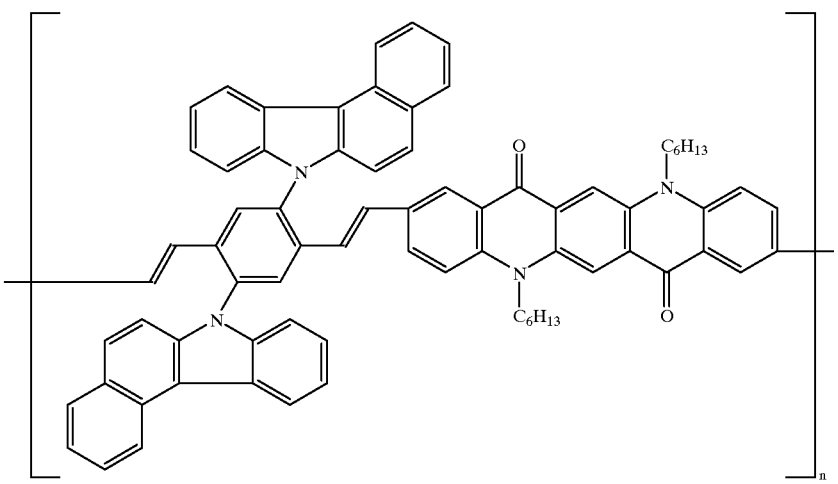
polymer 39
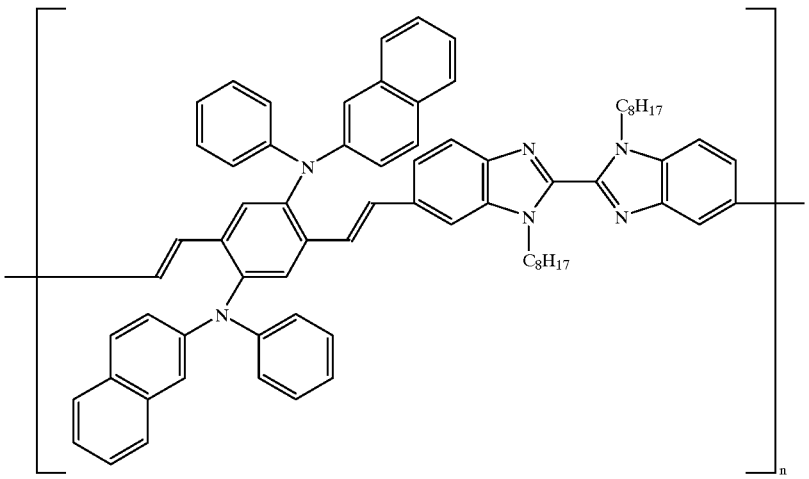

-continued
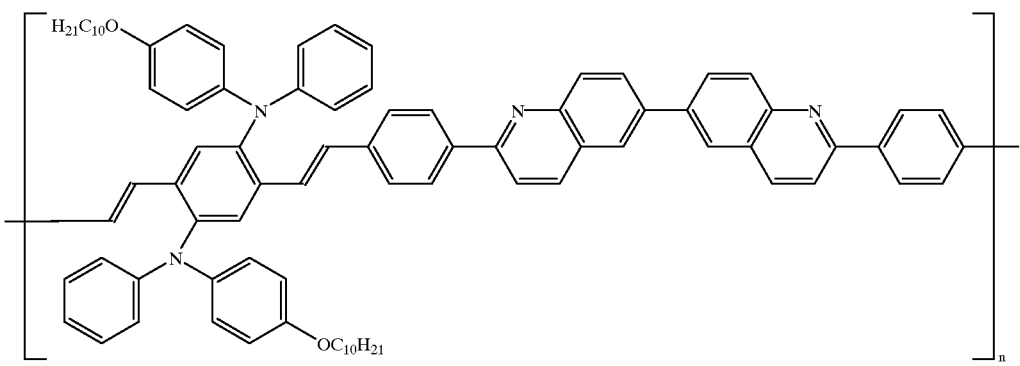
polymer 40
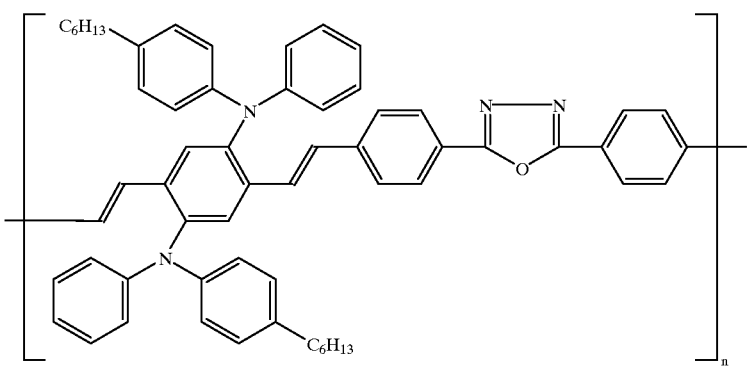
polymer 41
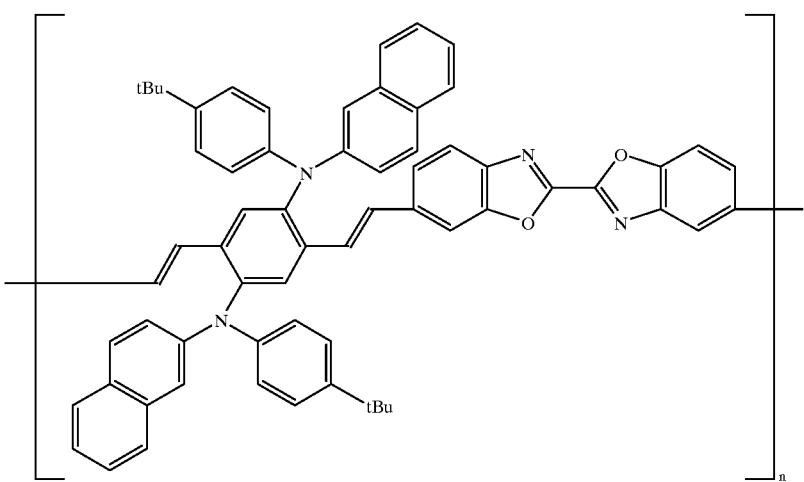
polymer 42

-continued
polymer 43
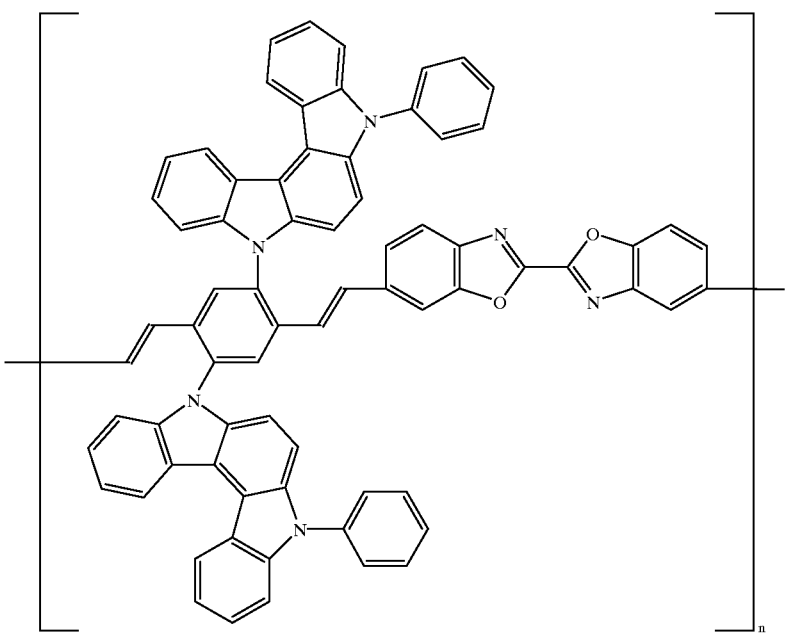
polymer 44
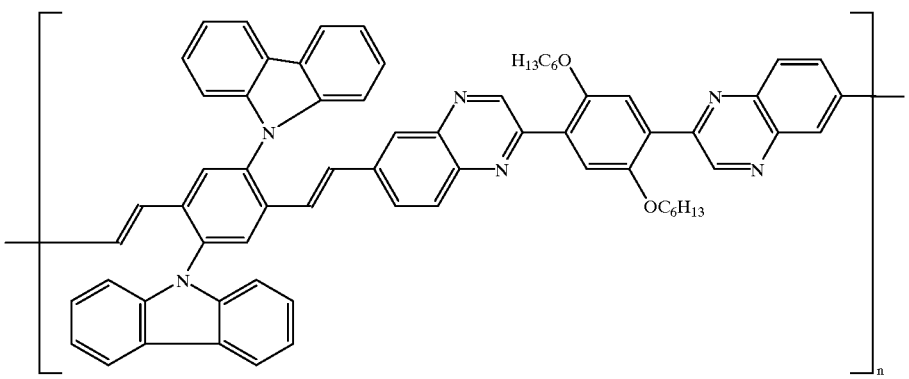
polymer 45
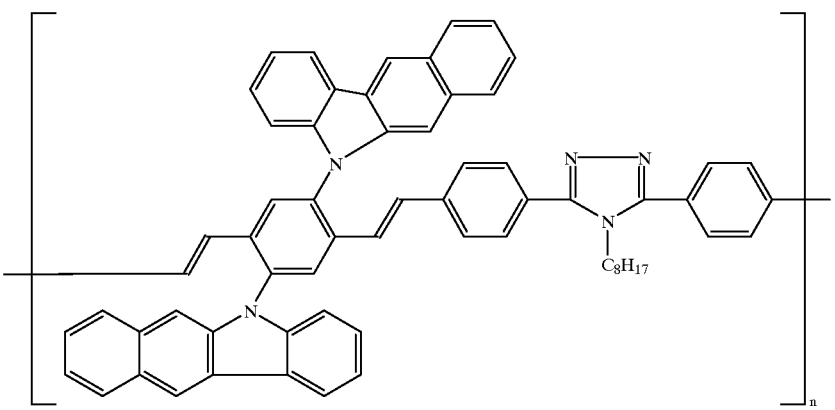

-continued

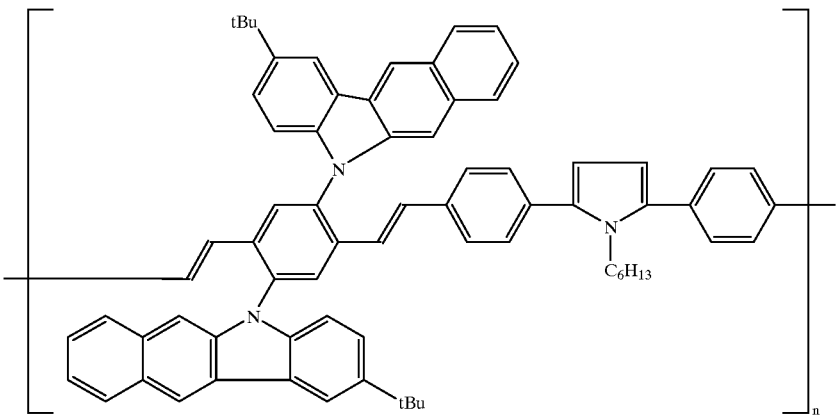

polymer 46

In the formula:

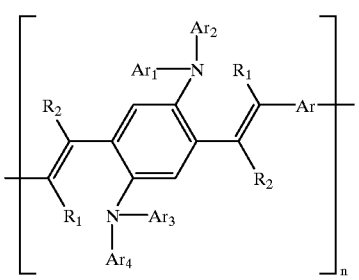

Ar can be one or the combination of more than one of the above divided groups. The specific molecular structures can be the combination of any of the above drawn structures.

The polymerization method and the molecular weights of the resulting polymers used in the present invention are illustrative only. The polymers may be prepared by condensation polymerizations such as Wittig reaction, Horner-Emmmons reaction, Knoevenagel condensation, Heck reaction, or a precursor method (Science, 1995, 269, 376), preferably by a Horner-Emmons reaction or a Knoevenagel reaction. According to the present invention, the above mentioned polymers were prepared by a Horner-Emmons reaction between an aromatic dicarboxyaldehyde and a diphosphate, or a Knoevenagel reaction using an aromatic dicarboxyaldehyde and a dicyano compound in the presence of a strong base such as potassium t-butoxide or sodium hydride. The synthetic schemes for polymers and monomers are illustrated in Schemes 1–6.

FIG. 1 illustrates the basic structure used to construct organic EL devices. It is a bi-layer structure including a hole transport layer 30 and an electron transport layer 40. The electron transport layer 40 is also the emissive layer from which electroluminescence originates. Together they form the EL medium 50. The anode layer 20 is adjacent to the hole transport layer 30 and the cathode 60 is adjacent to the electron transport layer 40. The substrate is layer 10. This figure is for illustration only and the individual layer thickness is not scaled according to the actual thickness.

Figure 2:
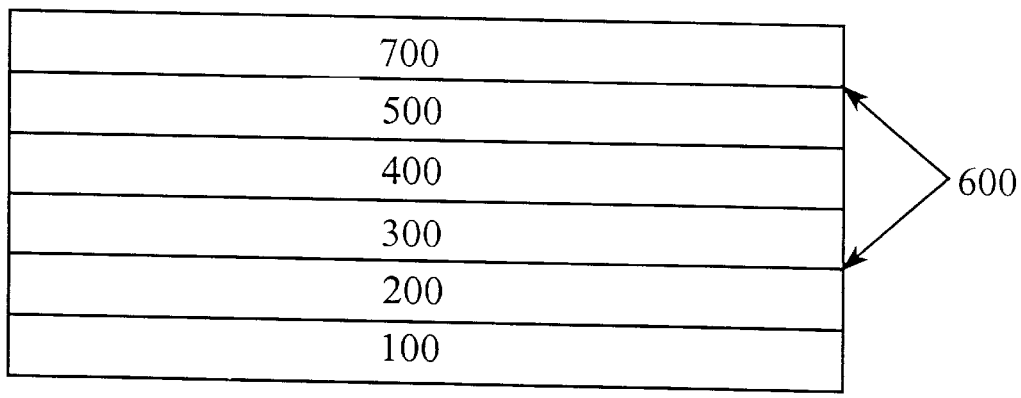
FIG. 2 illustrates a cross-section of a modified bi-layer EL device which can use a polymer in accordance with the present invention.

FIG. 2 illustrates an alternative construction of the EL device. It is a modified bi-layer structure. The EL medium contains an emissive layer between the hole transport layer and the electron transport layer. This emissive layer is the layer where electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

The bi-layer EL devices are the basic structure providing high luminous efficiency and low operating voltage. Alternative EL device structures have been demonstrated to provide improved device performance. These alternative structures include features in addition to the basic bi-layer structure such as the following structure A) hole injection layer as disclosed in commonly-assigned U.S. Pat. No. 4,356,429; B) cathode modification with alkaline or alkaline halides as disclosed in commonly-assigned U.S. Pat. No. 5,776,622; C) anode modification with plasma-deposited fluorocarbons as disclosed in commonly-assigned U.S. patent application Ser. No. 09/191,705; and D) doped emitter layer inserted between the hole transport and electron transport layer as disclosed in commonly-assigned U.S. Pat. No. 4,769,292.

Figure 3:
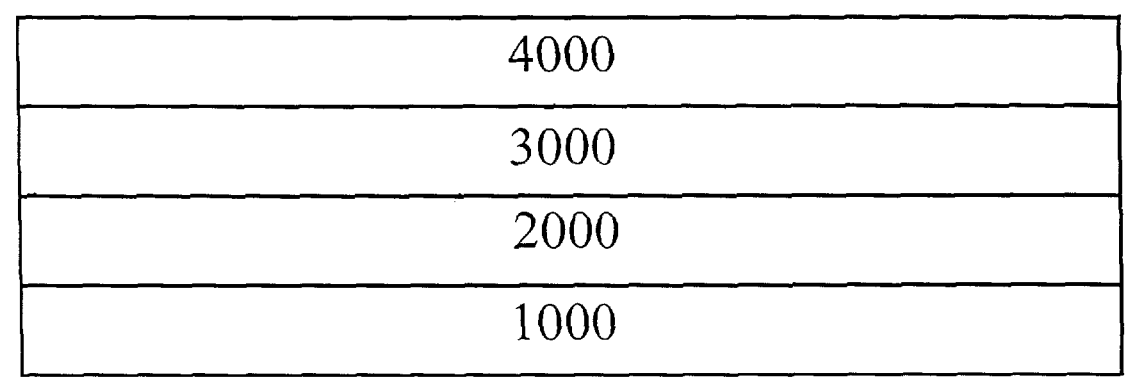

FIG. 3 illustrates another alternative construction of an EL device. It is a single-layer structure comprising an emitting layer 3000, sandwiched between an anode 2000 and cathode 4000. The emitting layer 3000 also acts as a charge carrier layer. Thus, single layer 3000 is the electroluminescent medium. The substrate is layer 1000. This figure is for illustration only and the individual layer thickness is not scaled according to the actual thickness.

A preferred EL device structure of this invention is a single-layer structure including an anode, a cathode, and single layer of electroluminescent medium. This electroluminescent layer is the emissive layer, and is also capable of transporting electrons as well as holes. The principle function of this layer is to provide efficient emissive centers for electroluminescence. This layer can include one of the above mentioned polymers or the blend of two or more polymers, or polymers doped with one or more fluorescent dyes (FD) or other light-emitting material. The fluorescent dye is usually present in an amount on the order of a few molar percent or less of the host polymer and it is sufficient to cause the EL emission to be predominantly that of the fluorescent dye. Using this method, highly efficient EL devices can be constructed. Simultaneously, the color of the EL devices can be tuned using fluorescent dyes of different emission wavelengths. By using a mixture of fluorescent dyes, EL color characteristics of the combined spectra of the individual fluorescent dyes are produced. This dopant scheme has been described in considerable detail for EL devices in commonly-assigned U.S. Pat. No. 4,769,292. An important criterion for choosing a fluorescent dye as a dopant capable of modifying the hue of light emission when present in a host material is a comparison of their energy bandgap. For efficient energy transfer from the host to the dopant molecule, a necessary condition is that the energy bandgap of the dopant is smaller than that of the host polymer. Preferred fluorescent dyes used as the dopant in the emissive layer include but are not limited to coumarins, stilbenes, distrylstibenes, anthracene derivatives, tetracene, perlenes, rhodamines, and arylamines.

The molecular structures of the preferred fluorescent dyes for the emissive layer in the EL device are listed as follows:

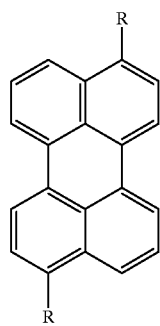

FD 1  R = H
FD 2  R = CO$_2$Pr-i

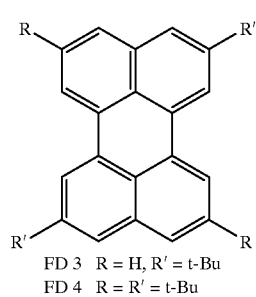

FD 3  R = H, R' = t-Bu
FD 4  R = R' = t-Bu

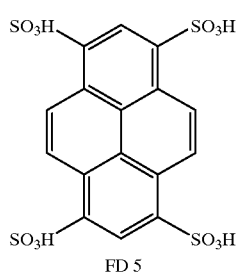

FD 5

-continued

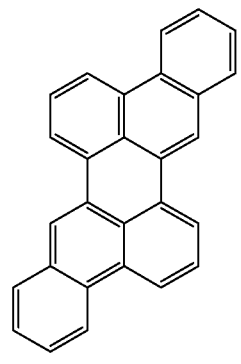

FD 6

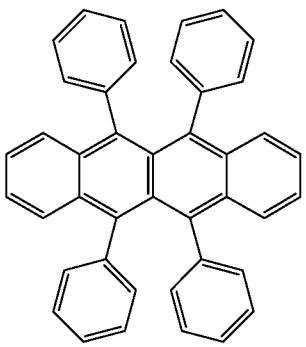

FD 7

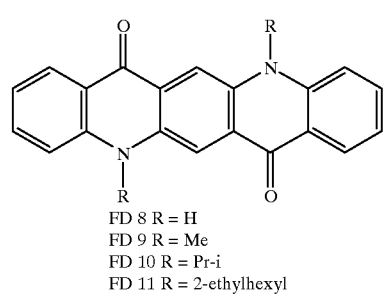

FD 8 R = H
FD 9 R = Me
FD 10 R = Pr-i
FD 11 R = 2-ethylhexyl

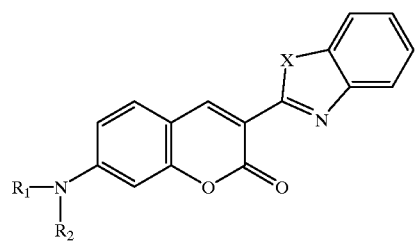

FD 12 R$_1$ = R$_2$ = Me, X = O
FD 13 R$_1$ = R$_2$ = hexyl, X = O
FD 14 R$_1$ = R$_2$ = phenyl, X = O
FD 15 R$_1$ = R$_2$ = Me, X = S
FD 16 R$_1$ = R$_2$ = hexyl, X = S
FD 17 R$_1$ = R$_2$ = phenyl, X = S -continued

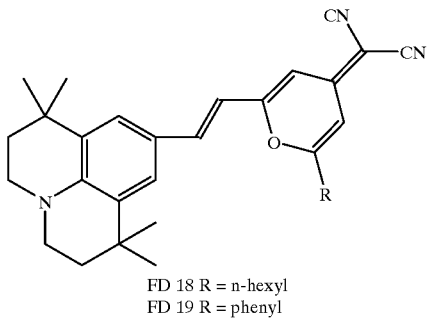

FD 18 R = n-hexyl
FD 19 R = phenyl

The above mentioned polymers can be deposited as high quality transparent thin films by spin-coating or inkjet printing the polymer solutions. Preferably, the spin-coating technique is used to form layer 3000, and preferably, only one polymer is deposited as single layer of electroluminescent medium.

Preferred materials for use in forming the anode modified with fluorocarbons are disclosed in commonly-assigned U.S. patent application Ser. No. 09/191,705.

Preferred materials for use in forming the cathode of the EL devices of this invention are Mg, Li, or alloys of these materials as disclosed in U.S. Pat. No. 5,429,884 and commonly-assigned U.S. Pat. No. 5,776,622.

EXAMPLES

The invention and its advantages are further illustrated by the following specific examples:

Synthesis of Monomers

Monomers to be used in the present invention are illustrative only. Any monomers can be used as long as the polymer formed satisfies the general formula:

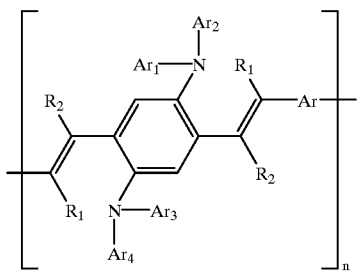

Typical monomer and polymer synthesis is illustrated in Schemes 1–6.

Scheme 1

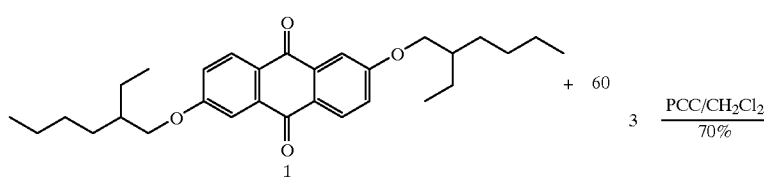

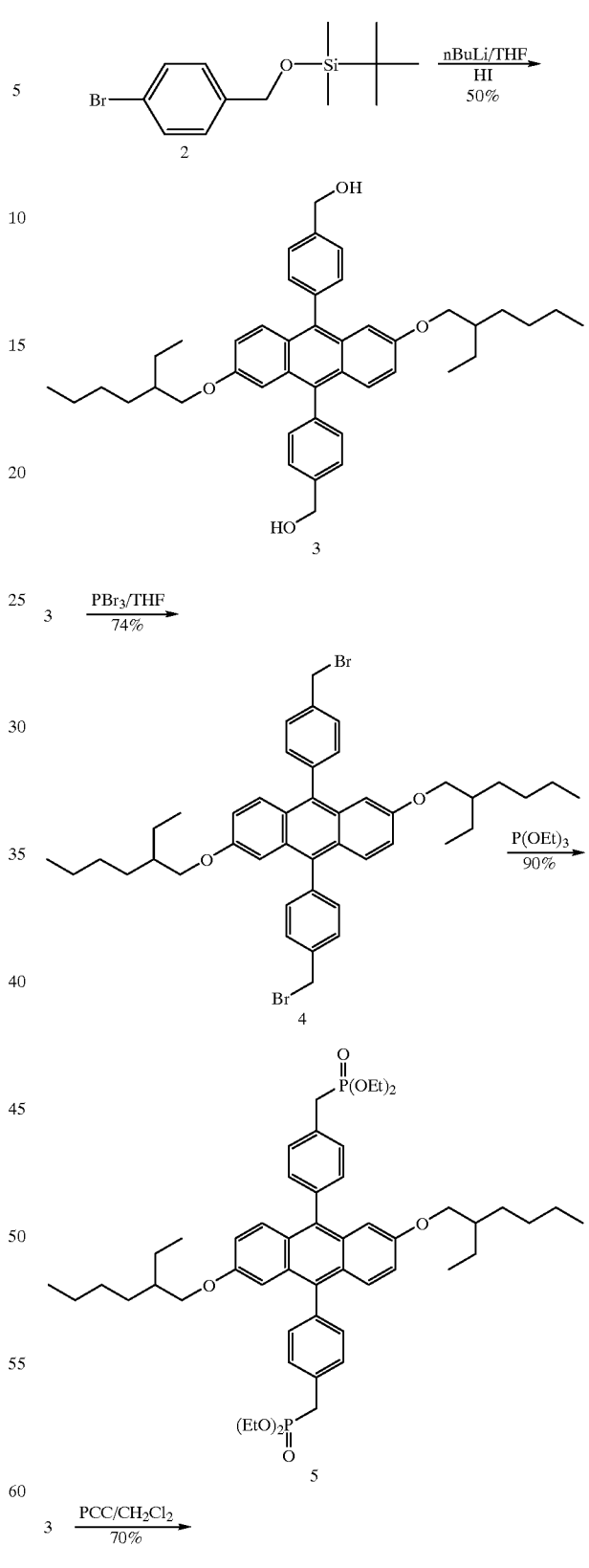

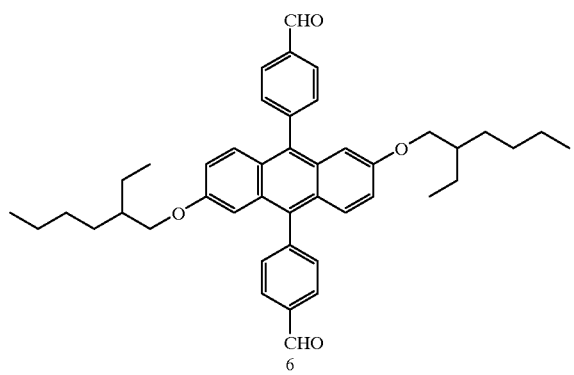
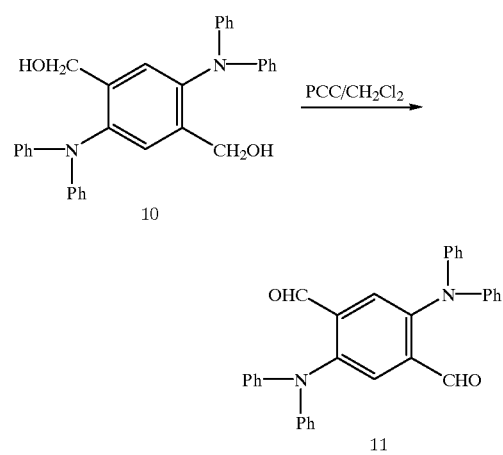
Scheme 2
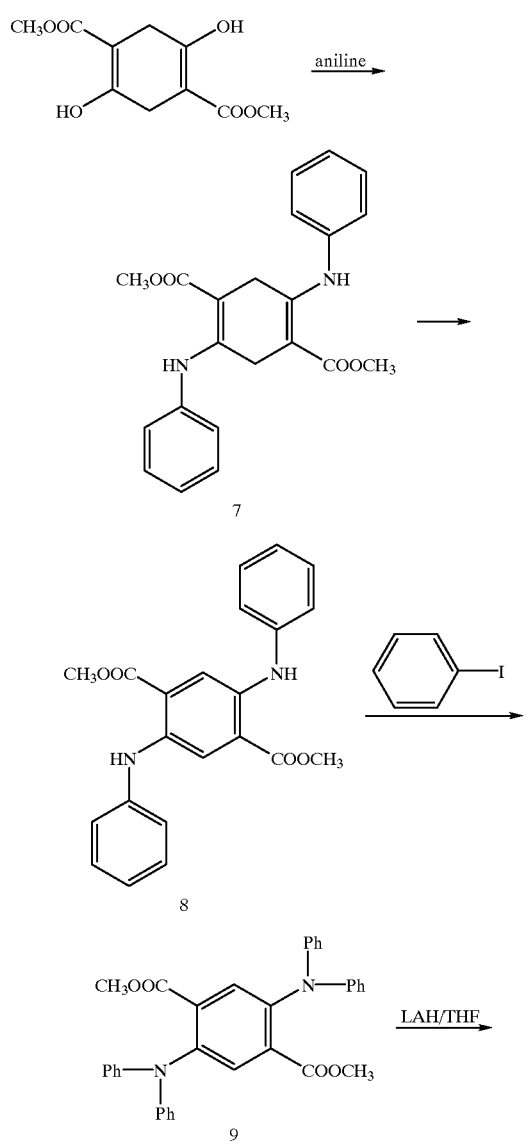
Scheme 3
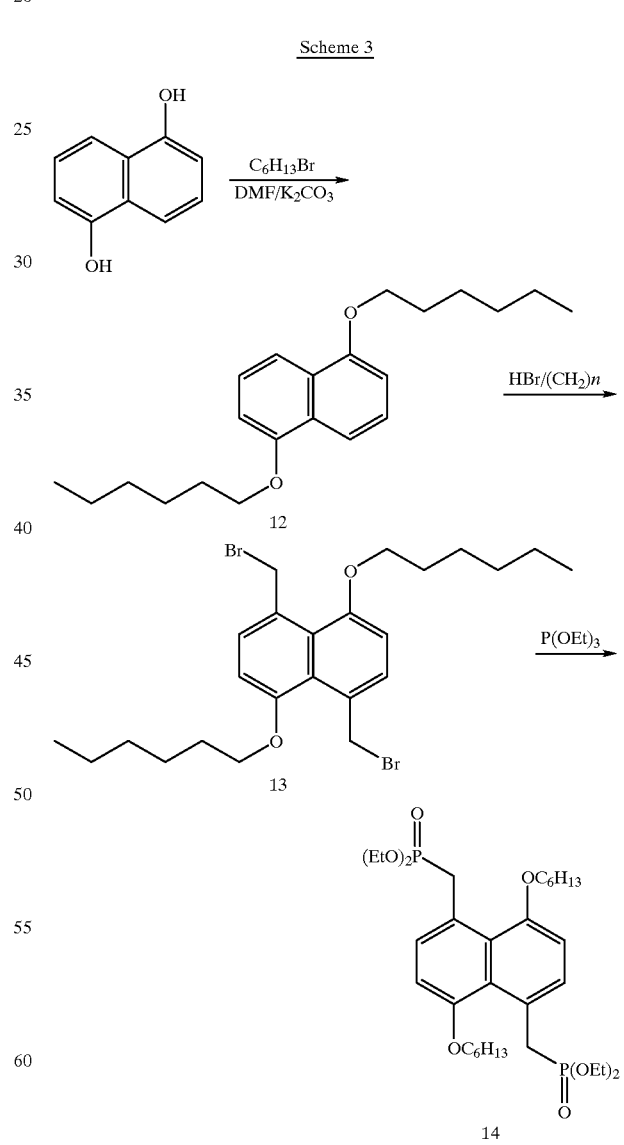

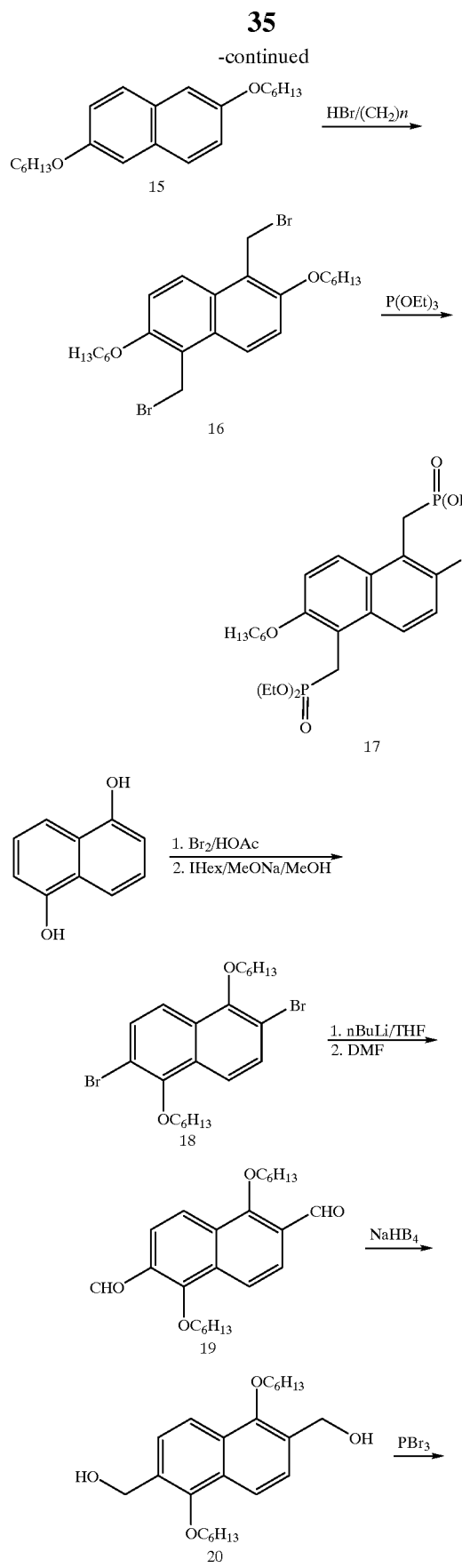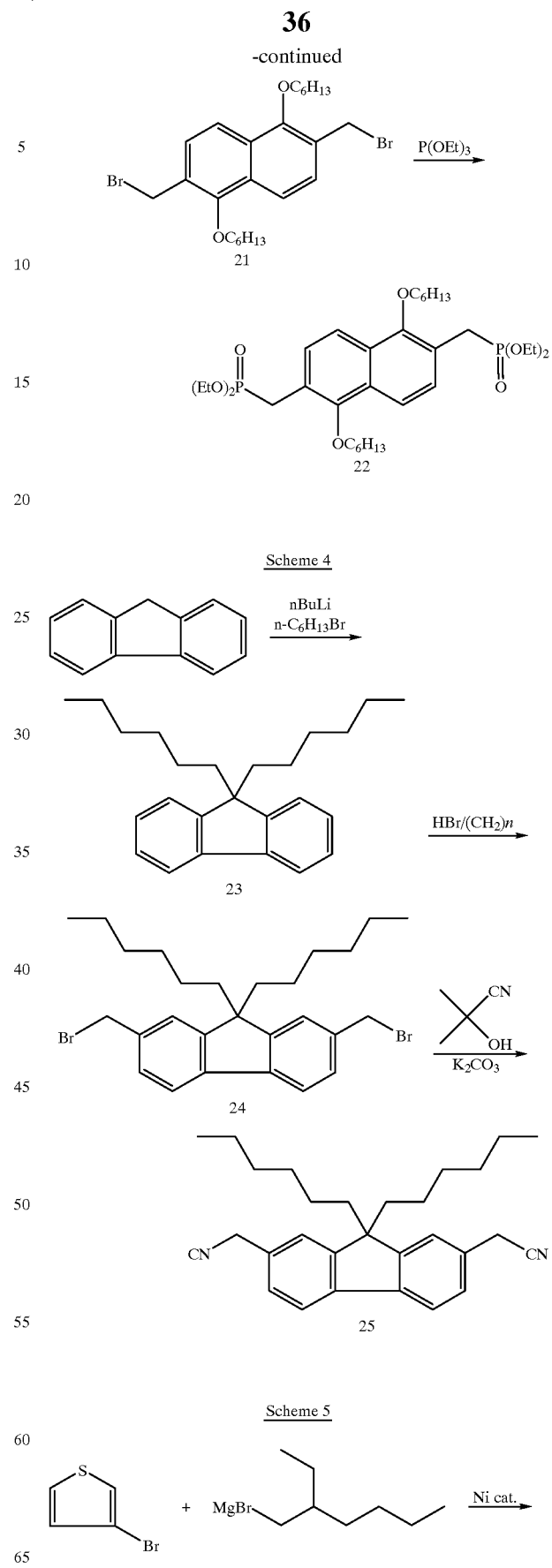

-continued

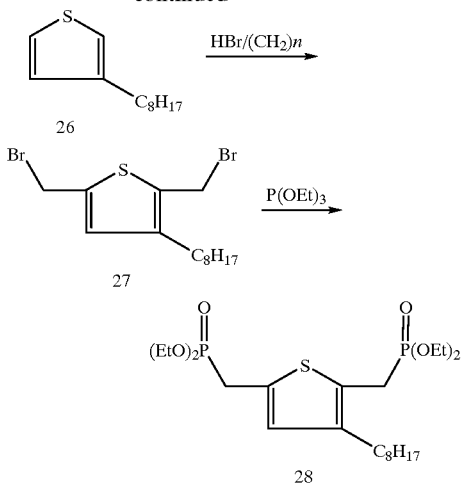

Scheme 6

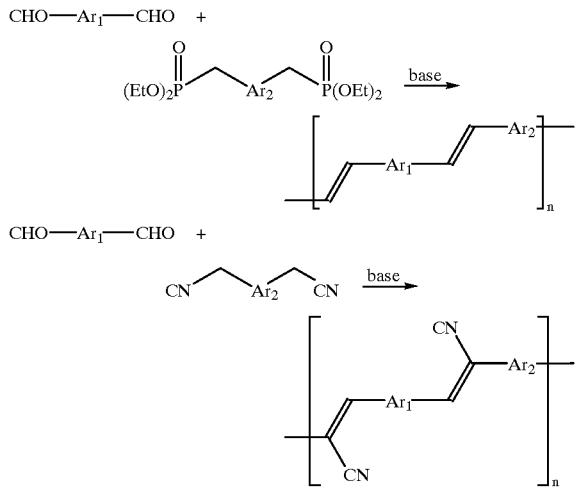

Example 1

Synthesis of 2,6bis(2-ethylhexyloxy)anthraquinone (compound 1)

2,6-Dihydroxyanthraquinone (100.0 g, 0.42 mol) and 2-ethylhexyl bromide (165.0 g, 0.86 mol) were dissolved in 1 L of DMF. To this solution was added anhydrous $K_2CO_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over $MgSO_4$. Solvent was removed and the crude product was recrystallized from methanol to give yellow powdery product 125.21 g (65% yield). $^1H$ NMR ($CDCl_3$) δ (ppm): 0.92–0.98 (m, 12H, $CH_3$), 1.34–1.54 (m, 16H), 1.75–1.81 (m, 2H, C$\underline{H}$($CH_3$)), 4.02 (d, J=5.5 Hz, 4H, $OCH_2$), 7.19 (d, J=8.4 Hz, 2H), 7.70 (s, 2H), 8.19 (d, J=8.5 Hz, 2H); $^{13}C$ NMR ($CDCl_3$): 11.12, 14.06, 23.04, 23.88, 29.08, 30.51, 39.34, 71.34, 110.64, 120.84, 127.00, 129.62, 135.88, 164.29, 182.27. M.p. 49–51° C.; FD-MS: m/z 464 ($M^+$).

Example 2

Synthesis of 4bromo-2-t-butyldimethylsilyloxymethylbenzene (compound 2)

To a 1-L round-bottomed flask were added 4-bromobenzyl alcohol (100.0 g, 0.53 mol), imidazole (91.0 g, 1.34 mol), t-butyldimethylsilyl chloride (TBDMS-Cl) (96.5 g, 0.64 mol), and DMF 100 mL. The reaction mixture was stirred at room temperature under nitrogen overnight. The reaction was poured into water and extracted with ether three times and the combined organic phase was washed with water three times and dried over $MgSO_4$. After solvent was removed, the product was obtained as light yellow liquid 154 g (62% yield). $^1H$ NMR ($CDCl_3$) δ (Ppm): 0.07 (s, 9H), 0.91 (s, 6H), 4.65 (s, 2H), 7.17 (d, J=8.2 Hz, 2H), 7.42 (s, J=8.3 Hz, 2H); $^{13}C$ NMR ($CDCl_3$): −1.71, 21.93, 29.48, 67.89, 124.13, 131.27, 134.82, 144.02; FD-MS: m/z 301 ($M^+$).

Example 3

Synthesis of 2,6-bis(2-ethylhexyloxy)-9,10-di(4-hydroxymethylphenyl)anthracene (compound 3)

Compound 2 (67.2 g, 0.22 mol) was dissolved in 300 mL of anhydrous THF and cooled to −78° C. To this solution was added n-BuLi (2.5 M in hexane, 86 mL, 0.22 mol) slowly to maintain the temperature lower than −60° C. After addition, the orange-yellow solution was stirred at −78° C. for an hour. Compound 1 (30.0 g, 0.065 mol) was dissolved in 200 mL of anhydrous THF and added dropwise to the above cooled solution. TLC analysis indicated the completion of the reaction. The reaction was warmed up slightly and HI solution (57% in water, 145 g, 0.65 mol) was added slowly to quench the reaction and to de-protect the TBDMS group. The deep brown reaction was heated at reflux for 10 min. and most of the solvent was removed under reduced pressure. The reaction mixture was then extracted with methylene chloride three times. The combined organic phase was washed with saturated sodium metabisulfate solution, water, and brine, and dried over $MgSO_4$. The crude product was obtained as brown viscous oil and was purified by column chromatography on silica gel with 20:80 ether:hexane as eluent. The pure product was obtained as light green-yellow solid 20.2 g (48% yield). $^1H$ NMR ($CDCl_3$) δ (ppm): 0.82–0.89 (m, 12H, $CH_3$), 1.26–1.43 (m, 16H), 1.60–1.66 (m, 2H), 1.85 (s, br, 2H, OH), 3.72 (d, J=5.5 Hz, 2H, $OCH_2$), 4.89 (s, 4H, benzylic), 6.84 (d, J=2.0 Hz, 2H), 7.00 (dd, $J_1$=9.3 Hz, $J_2$=2.2 Hz, 2H), 7.47 (d, J=7.9 Hz, 4H, phenyl ring), 7.52 (d, J=9.7 Hz, 2H), 7.61 (d, J=7.8 Hz, 4 H, phenyl ring); $^{13}C$ NMR ($CDCl_3$): 11.17, 14.03, 23.00, 23.89, 29.08, 30.64, 39.16, 65.37, 70.17, 103.90, 120.07, 126.98, 127.13, 128.07, 129.56, 131.46, 134.74, 138.95, 139.85, 155.71; M.p. 110–112° C.; FD-MS: m/z 646 ($M^+$).

Example 4

Synthesis of 2,6bis(2ethylhexyloxy)-9,10-di(4-bromomethylphenyl)anthracene (compound 4)

Compound 3 (4.40 g, 6.8 mmol) was dissolved in 25 mL of anhydrous THF and cooled to 0° C. $PBr_3$ (1.3 mL, 17 mmol) was added dropwise. The reaction was stirred at room temperature overnight and then quenched with water, extracted with methylene chloride. The combined organic phase was washed with brine and dried over $MgSO_4$. The crude product was purified by column chromatography on silica gel using 15:85 $CH_2Cl_2$:hexane as eluent to give 3.90 g of yellow crystals (74% yield). $^1$H NMR (CDCl$_3$) δ (ppm): 0.82–0.88 (m, 12H, CH$_3$), 1.23–1.42 (m, 16H), 1.61–1.69 (m, 2H), 3.71 (d, J=5.7 Hz, OCH$_2$), 4.67 (s, 4H, benzylic), 6.78 (d, J=2.4 Hz, 2H), 7.00 (dd, J$_1$=9.5 Hz, J$_2$=2.4 Hz, 2H), 7.43 (d, J=8.0 Hz, 4H, phenyl ring), 7.49 (d, J=9.5 Hz, 2H), 7.62 (d, J=8.0 Hz, 4H, phenyl ring); $^{13}$C NMR (CDCl$_3$): 11.15, 14.06, 23.04, 23.88, 29.03, 30.62, 33.46, 39.06, 70.36, 103.83, 120.29, 126.81, 127.98, 129.27, 129.53, 131.68, 134.40, 136.91, 139.84, 155.80; M.p. 105–107° C.; FD-MS: m/z 772 (M$^+$).

Example 5

Synthesis of 2,6bis(2-ethylhexyloxy)-9,10-di(4-methylenediethylphosphate phenyl)anthracene (compound 5)

Compound 4 (3.80 g, 4.9 mmol) and trietbyl phosphite 95 mL, 29 mmol) were placed in a 50-mL round-bottomed flask and heated to 100° C. for 4 hours. After cooled to room temperature, the product was recrystallized from hexane to give 3.94 g of cream color fine needle crystals (90% yield). $^1$H NMR (CDCl$_3$) δ (ppm): 0.83–0.89 (m, 12H, CH$_3$), 1.27–1.43 (m, 28H), 1.59–1.66 (m, 2H), 3.34 (d, J=41.7 Hz, 4H, benzylic), 3.71 (d, J=5.3 Hz, 4H, OCH$_2$), 4.08–4.18 (m, P(O)OCH$_2$, 8H), 6.84 (d, J=2.3 Hz, 2H), 6.99 (dd, J$_1$=9.5 Hz, J$_2$=2.4 Hz, 2H), 7.42 (d, J=7.8 Hz, 4H, phenyl ring), 7.48 (d, J=9.5 Hz, 2H), 7.55 (dd, J$_1$=8.0Hz, J$_2$=2.2Hz, 4H, phenyl ring); $^{13}$C NMR (CDCl$_3$): 11.21, 14.04, 16.46, 16.54, 23.01, 23.92, 29.14, 30.66, 32.89, 34.72, 39.37, 62.20, 62.29, 70.02, 103.95, 120.00, 127.00, 128.06, 129.56, 129.99, 130.08, 130.71, 130.83, 131.44, 131.47, 134.67, 138.12, 138.17, 155.76; M.p. 94–96° C.; FD-MS: m/z 886 (M$^+$).

Example 6

Synthesis of 2,6bis(2-ethylhexyloxy)-9,10-di(4-formylphenyl)anthracene (compound 6)

Compound 3 (10.0 g, 0.015 mol) was dissolved in 180 mL of methylene chloride and pyridinium chlorochromate (PCC) (8.0 g, 0.037 mol) was added. The reaction was stirred at room temperature overnight. The reaction was quenched with 100 mL of water and stirred for 1 h. The deep brown reaction mixture was filtered through a pad of celite and was extracted with methylene chloride three times. The combined organic phase was washed with dilute HCl, water, and brine, and dried over MgSO$_4$. The crude product was purified by column chromatography on silica gel with 1:1 CH$_2$Cl$_2$:hexane as eluent to give pure product as bright yellow crystals 7.0 g (70% yield). $^1$H NMR (CDCl$_3$) δ (ppm): 0.82–0.88 (m, 12H, CH$_3$), 1.20–1.43 (m, 16H), 1.60–1.68 (m, 2H), 3.70 (d, J=5.5 Hz, OCH$_2$), 6.73 (d, J=2.2 Hz, 2H), 7.04 (dd, J$_1$=9.5 Hz, J$_2$=2.4 Hz, 2H), 7.44 (d, J=9.5Hz, 2H), 7.67 (d, J=8.0 Hz, 4H, phenyl ring), 8.15 (d, J=8.0 Hz, 4H, phenyl ring), 10.21 (s, 2H, aldehyde); $^{13}$C NMR (CDCl$_3$): 11.13, 14.02, 22.97, 23.87, 29.07, 30.59, 39.12, 70.22, 103.37, 120.80, 127.59, 129.12, 130.00, 132.03, 134.01, 135.69, 146.38, 156.10, 192.00; M.p. 125–127° C.; FD-MS: m/z 642 (M$^+$).

Example 7

Synthesis of Dimethyl 2,5-bis(diphenylamino)-3,6-dihydroterephthalate (compound 7)

Dimethyl succinylo succinate (DMSS, 50 g, 0.22 mol) is placed into a round-bottomed flask. Aniline (100 ml) is used in excess as a solvent and the reaction mixture is heated to 100° C. for 2 hours during which a solid precipitated out of solution. TLC analysis (CH$_2$Cl$_2$:Hexane/1:1) showed the presence of DMSS so the reaction temperature was increased to 120° C. and stirred for additional 4 hours. The reaction was cooled, and EtOH was added. The product was collected by vacuum filtration. The crude product was washed with additional EtOH until washings were almost colorless. The product was oven dried to give an orange solid 82 g (quantitative yield). $^1$H NMR (CDCl$_3$) δ (ppm): 3.39 (s, 4H), 3.65 (s, 6H, COOCH$_3$), 7.09–7.38 (m, 10H, aromatics), 10.62 (s, 2H, NH); $^{13}$C NMR (CDCl$_3$): 27.65, 50.84, 88.71, 124.63, 124.75, 129.12, 139.35, 156.74, 169.31; M.p. 236–238° C.; FD-MS: m/z 378 (M$^+$).

Example 8

Synthesis of Dimethyl 2,5-bis(diphenylamino) terephthalate (compound 8)

Compound 7 (80 g, 0.21 mol) was dissolved in CH$_2$Cl$_2$ and heated gently during which the solution turned dark red in color. TLC (CH$_2$Cl$_2$:hexane/1:1) was used to monitor the reaction. Once all starting material was gone, CH$_2$Cl$_2$ was partially removed by rotary evaporation and replaced with EtOH. Once all the CH$_2$Cl$_2$ was removed, the red solid was collected by vacuum filtration while hot and washed with EtOH until washings are almost colorless.

Product was collected and oven dried to give 73 g red solid (92% yield).). $^1$H NMR (CDCl$_3$) δ (ppm): 3.83 (s, 6H, COOCH$_3$), 7.00–7.34 (m, 10H, aromatics), 8.00 (s, 2H, aromatics), 8.56 (s, br, 2H, NH); $^{13}$C NMR (CDCl$_3$): 52.20, 118.58, 118.96, 119.71, 122.06, 129.38, 137.71, 141.88, 167.78; M.p. 164–166° C.; FD-MS: m/z 376 (M$^+$).

Example 9

Synthesis of Dimethyl N,N,N',N'-tetraphenyl 2,5-diaminoterephthalate (compound 9)

Compound 8 (40 g, 0.11 mol), iodobenzene (200 ml, 1.79 mol), K$_2$CO$_3$ (20 g, 0.14 mol), and copper (1.4 g, 0.022 mol) were all placed in a round-bottomed flask under N$_2$. The mixture was heated at 185° C. for 24 hours. TLC (CH$_2$Cl$_2$:hexane/1:1) indicated the completion of the reaction. The reaction was cooled and CH$_2$Cl$_2$ was added. After filtering and washing with CH$_2$Cl$_2$, the filtrate was concentrated to give a suspension. EtOH was added and the resulting precipitate was collected by filtration and washed with EtOH. The product was oven dried to give a yellow solid 45 g (80% yield). $^1$H NMR (CDCl$_3$) δ (ppm): 3.35 (s, 6H, COOCH$_3$), 6.96–7.28 (m, 20H, aromatics), 8.44 (s, 2H, aromatics); $^{13}$C NMR (CDCl$_3$): 51.94, 122.69, 123.00, 129.18, 131.00, 132.47, 142.17, 147.32, 166.76; M.p. 249–251° C.; FD-MS: m/z 528 (M$^+$).

Example 10

Synthesis of 1,4-dihydroxymethyl2,5-bis(N,N-diphenylamino)benzene (compound 10)

LiAlH$_4$ (6.4 g, 0.17 mol) was placed under N$_2$ in a round-bottomed flask equipped with a reflux condenser. The flask was charged with anhydrous THF (400 ml) and the suspension was cooled to 0° C. Compound 9 (40 g, 0.076 mol) was added in portions over 60 min. The mixture was warmed to room temperature for 15 min. and then refluxed for 45 min. TLC (CH$_2$Cl$_2$:hexane/1:1) the completion of the reaction. The reaction was cooled to 0° C. and quenched carefully with water. After stirring for 30 minutes, ether was added. The aqueous layer was extracted 4 times with ether. The combined organic phase was dried over $Na_2SO_4$ and concentrated to give a brown solid. This solid was recrystallized from toluene to give a yellow solid 34 g (95% yield). AA8790-138). 4.36 (s, 4H, benzylic), 7.00–7.50 (m, 22H, aromatics); M.p. 208–210° C.; FD-MS: m/z 472 ($M^+$).

Example 11

Synthesis of 2,5bis(N,N-dipheylamino)-terephthaldicarboxyaldehyde (compound 11)

Pyridinium Chlorochromate (PCC, 30 g, 0.064 mol) and anhydrous $CH_2Cl_2$ (350 ml) are placed in a flask under $N_2$. Compound 10 was added in portions during which time the mixture turns black. TLC ($CH_2Cl_2$:hexane/1:1) indicated the disappearance of the starting material after 90 minutes while a new red spot appeared. The entire reaction mixture was filtered over a pad of celite on a fritted funnel. The funnel is washed thoroughly with $CH_2Cl_2$ until the washings are almost colorless. The filtrate was concentrated and purified using column chromatography ($CH_2Cl_2$:hexane/1:1). After concentrating the pure fractions from the column, hexane was added and the product was collected by vacuum filtration and washed with additional hexane. The product was oven dried to give a dark red crystalline solid 21.5 g (72% yield). $^1$H NMR ($CDCl_3$) δ (ppm): 7.01–7.06 (m, 12H), 7.24–7.29 (m, 8H), 7.61 (s, 2H), 10.13 (s, 2H); ); $^{13}$C NMR ($CDCl_3$): 123.13, 123.53, 129.10, 129.80, 136.49, 146.49, 148.34, 189.51; M.p. 260–262 ° C.; FD-MS: m/z 468 ($M^+$).

Example 12

Synthesis of 1,5-bis(hexyloxy)naphthalene (compound 12)

To a 500 mL round-bottomed flask were added 1,5-dihydroxynaphthalene (15.0 g, 0.094 mol), potassium carbonate (27.2 g, 0.2 mol), n-hexylbromide (32.5 g, 0.2 mol), and 200 mL of DMF. The reaction was heated to 90° C. overnight, cooled to room temperature, and poured into 700 mL of water. The dark brown precipitate was filtered and washed with methanol. The crude product was refluxed in methanol and then filtered to give light green solid 25.2 g (80% yield). $^1$H NMR ($CDCl_3$) δ (ppm): 0.92 (t, J=6.5 Hz, 6H), 1.35–1.41 (m, 8H), 1.52–1.57 (m, 4H), 1.85–1.92 (m, 4H), 4.10 (t, J=6.4 Hz, 4H), 6.81 (d, J=7.6 Hz, 2H), 7.30–7.36 (m, 2H), 7.84 (d, J=8.3 Hz); M.p. 92–93° C.

Example 13

Synthesis of 1,5-bis(bromomethyl)-4,8-bis(hexyloxy)naphthalene (compound 13)

Compound 12 (10.0 g, 0.030 mol) and paraformaldehyde (1.92 g, 0.064 mol) were dissolved in 10 mL of acetic acid and HBr in acetic acid solution (33% in acetic acid,12.3 mL, 0.064 mol). The reaction was heated at 50° C. for 5 h and cooled to room temperature. The greenish precipitate was filtered, washed with water, methanol, and dried. The crude product was recrystallized from hexane to yield off-white needle like crystal 14.7g (94% yield). ). $^1$H NMR ($CDCl_3$) δ (Ppm): 0.92 (t, J=6.5 Hz, 6H), 1.36–1.41 (m, 8H), 1.51–1.57 (m, 4H), 1.99–2.09 (m, 4H), 4.13 (t, J=6.4 Hz, 4H), 5.31 (s, 4H), 6.84 (d, J=8.2 Hz, 2H), 7.37 (d, J=8.2 Hz, 2H); M.p. 105–107° C.

Example 14

Synthesis of 4,8-bishexyloxyl-1,5-bis(methylenediethylphosphate)naphthalene (compound 14)

To a 50 mL round-bottomed flask were added compound 13 (9.0 g, 0.017 mol) and triethyl phosphite (7.5 mL, 0.044 mol). The mixture was heated to 100° C. for 4 hours and cooled to room temperature. The crude product was purified by column chromatography on silica gel using 10:90 acetone:methylene chloride as an eluent to give light brown solid which was recrystallized from hexane to give pure product as off-white needle like crystals 6.5 g (59% yield). $^1$H NMR ($CDCl_3$) δ (ppm): 0.92 (t, J=6.8 Hz), 1.08 (t, J=7.1 Hz), 1.36–1.41 (m, 8H), 1.47–1.54 (m, 4H), 1.95–2.05 (m, 4H), 3.75–3.91 (m, 8H), 4.06–4.14(d and t overlap, 8H, benzylic and $OCH_2$), 4.14 (s, 4H), 6.80 (d, J=8.2 Hz, 2H), 7.23–7.27 (m, 2H); $^{13}$C NMR ($CDCl_3$): 13.94, 16.23, 16.31, 22.52, 25.94, 28.84, 31.60, 33.92, 35.76, 61.34, 61.43, 68.84, 106.28, 106.29, 119.77, 119.92, 130.14, 130.24, 156.04; M.p. 80–82° C.; FD-MS: m/z 628 ($M^+$).

Example 15

Synthesis of 2,6bis(hexyloxy)naphthalene (compound 15)

2,6-Dihydroxynaphthalene (30.0 g, 0.19 mol) reacted with n-hexylbromide (97.5 g, 0.59 mol) in the presence of potassium carbonate (81.6 g, 0.59 mol) in 400 mL of DMF at 90° C. overnight. The reaction was poured into 700 mL of water and the precipitate was filtered, washed with water and methanol, and dried. The crude product was recrystallized from methanol to give light gray solid 41.3 g (67% yield). $^1$H NMR $CDCl_3$) δ (ppm): 0.91 (t, J=6.9 Hz, 6H), 1.32–1.40 (m, 8H), 1.44–1.54 (m, 4H), 1.77–2.86 (m, 4H), 4.02 (t, J=6.6 Hz, 4H), 7.06–7.12 (m, 4H), 7.60 (d, J=8.8 Hz, 2H); M.p. 78–79° C.

Example 16

Synthesis of 1,5-bis(bromomethyl)-2,6-bis(hexyloxy)naphthalene (compound 16)

Compound 15 (9.0 g, 0.030 mol) and paraformaldehyde (1.87 g, 0.062 mol) were dissolved in 40 mL of acetic acid and HBr in acetic acid solution (30% in acetic acid,12.4 mL, 0.062 mol). The reaction was heated at 50° C. for 5 h and cooled to room temperature. The light purple precipitate was filtered, washed with water, methanol, and dried. The crude product was recrystallized from hexane to yield off-white needle like crystal 9.0 g (58% yield).). $^1$H NMR ($CDCl_3$) δ (pPM): 0.93 (t, J=6.9 Hz, 6H), 1.37–1.42 (m, 8H), 1.51–1.61 (m, 4H), 1.84–1.93 (m, 4H), 4.18 (t, J=6.4 Hz, 4H), 5.07 (s, 4H), 7.35 (d, J=9.3 Hz, 2H), 8.03 (d, J=9.3 Hz, 2H); M.p. 110–112° C.

Example 17

Synthesis of 2,6-bis(hexyloxy)-1,5-bis(methylenediethylphosphate)naphthalene (compound 17)

To a 50 mL round-bottomed flask were added compound 16 (8.0 g, 0.16 mol) and triethyl phosphite (13 mL, 0.078 mol). The mixture was heated to 100° C. for 4 hours. Excess of triethyl phosphite was distilled off. The crude product was purified by column chromatography on silica gel using 10:90 acetone:methylene chloride as an eluent to give light orange solid which was recrystallized from hexane to give pure product as off-white needle like crystals 5.0 g (51% yield). $^1$H NMR ($CDCl_3$) δ (ppm): 0.92 (t, J=7.0 Hz, 6H), 1.15 (t, J=7.0 Hz, 12H), 1.34–1.53 (m, 12H), 1.79–1.89 (m, 4H), 3.71 (d, J=22.0 Hz, 2H), 3.91–3.96 (m, 8H), 4.10 (t, J=6.6 Hz, 4H), 7.28 (d, J=9.5 Hz, 2H), 8.02 (d, J=9.5 Hz, 2H); $^{13}$C NMR ($CDCl_3$): 13.99, 16.25, 16.33, 22.60, 25.78, 29.68, 31.64, 61.75, 61.84, 69.41, 113.73, 113.88, 114.66, 114.70, 125.12, 125.20, 128.78, 152.81; M.p.101–102° C.; FD-MS: m/z 628 (M$^+$).

Example 18

Synthesis of 2,6dibromo1,5-bis(hexyloxy) naphthalene (compound 18)

1,5-Dihydroxynaphthalene (20.0 g, 0.125 mol) was dissolved in 400 mL of acetic acid and cooled to 0° C. To this solution was added bromine (40.1 g, 0.250 mol) dropwise. The reaction was stirred at room temperature for an hour after addition and cooled in ice bath. The crystals were collected by filtration, washed with water, and dried to give light gray solid 2,6-dibromo-1,5-dihydroxynaphthalene 36.1 g (90% yield). The product (36.0 g, 0.114 mol) was mixed with sodium methoxide (13.0 g, 0.24 mol), and iodohexane (50.0 g, 0.24 mol) in 320 mL of methanol. The mixture was refluxed overnight and cooled to room temperature. The dark solid was collected, washed with water and methanol, and dried. The crude product was dissolved in methylene chloride and then passed through a short pad of silica gel to remove the dark polar impurities. The product was then recrystallized from methanol to give white flaky crystals 25.5 g (60% yield). $^1$H NMR (CDCl$_3$) δ (ppm): $^1$H NMR (CDCl$_3$) δ (pPpm): 0.93 (t, J=6.8 Hz, 6H), 1.36–1.41 (m, 8H), 1.55–1.60 (m, 4H), 1.88–1.98 )m, 4H), 4.06 (t, J=6.6 Hz, 4H), 7.58 (d, J=9.0 Hz, 2H), 7.73 (J=9.0 Hz, 2H); $^{13}$C NMR (CDCl$_3$): 14.03, 22.61, 25.69, 30.23, 31.69, 74.62, 113.73, 119.31, 130.11, 131.03, 148.04, 152.86; M.p. 41–43° C.; FD-MS: m/z 486 (M$^+$).

Example 19

Synthesis of 1,6-bis(hexyloxy)naphthalene-2,6-dicarboxaldehyde (compound 19)

Compound 18 (13.0 g, 0.027 mol) was dissolved in 110 mL of anhydrous THF and cooled to –78° C. under dry nitrogen. To this solution was added slowly nBuLi solution (2.5 M in hexane, 32 mL, 0.080 mol) via a syringe to maintain the temperature lower than –60° C. After addition the solution was stirred at –78° C. for 1 h. Anhydrous DMF (17 mL, 0.21 mol) was added via a syringe. The reaction was stirred at room temperature overnight. The reaction was quenched with water and extracted with ether (3×100 mL). The organic phase was washed with brine and dried over MgSO$_4$. After removal of the solvent the crude product was recrystallized from hexane to give 6.72 g of product as light yellow powder (65% yield). $^1$H NMR (CDCl$_3$) δ (ppm): 0.93 (t, J=6.7 Hz, 6H, CH$_3$), 1.37–1.42 (m, 8H, alkyl), 1.55–1.60 (m, 4H, alkyl), 1.95–2.00 (m, 4H, alkyl), 4.15 (t, J=6.7 Hz, 4H, OCH$_2$), 7.92 (d, J=8.8 Hz, 2H, naphthyl), 7.89 (d, J=8.8 Hz, 2H, naphthyl), 10.60 (s, 2H, CHO); $^{13}$C NMR (CDCl$_3$): 14.01, 22.59, 25.65, 30.25, 31.63, 79.50, 119.53, 123.69, 127.51, 133.19, 161.56, 189.51; M.p. 50–52° C.; FD-MS: m/z 384 (M$^+$).

Example 20

Synthesis of 1,5-bis(hexyloxy)-2,6-bis (hydroxymethyl)naphthalene (compound 20)

To 30 mL of methanol and 20 mL of methylene chloride was added sodium boron hydride (1.90 g, 50 mmol) at 0° C. The mixture was stirred for 10 min. and dialdehyde compound 19 (3.25 g, 8.4 mmol) dissolved in 10 mL of methylene chloride was added slowly through an additional funnel. The reaction was stirred at room temperature overnight and quenched with 30 mL of 1 M KOH and stirred for 30 min. The reaction was extracted with methylene chloride 3 times, washed with water, and dried over MgSO$_4$. The crude product was an off-white solid and was pure enough for next step, 2.91 g (88% yield). $^1$H NMR (CDCl$_3$) δ (ppm): 0.93 (t, J=6.8 Hz, 6H, CH$_3$), 1.37–1.42 (m, 8H, alkyl), 1.51–1.58 (m, 4H, alkyl), 1.87–1.97 (m, 4H, alkyl), 2.19 (s, br, 2H, OH), 4.00 (t, J=6.7 Hz, 4H, OCH$_2$), 4.88 (s, 4H, benzylic), 7.50 (d, J=8.6 Hz, 2H, naphthyl), 7.84 (d, J=8.6 Hz, 2H, naphthyl).

Example 21

Synthesis of 2,6-bis(bromomethyl)-1,5-bis (hexyloxy)naphthalene (compound 21)

Dialcohol compound 20 (2.90 g, 7.5 mmol) was dissolved in 15 mL of anhydrous THF and cooled to 0° C. To this solution was added PBr$_3$ (1.7 mL, 18 mmol) in 5 mL of THF. The reaction was stirred at room temperature overnight, quenched with water, and extracted with ether. The crude product was purified by column chromatography on silica gel using 5:95 ether:hexane as an eluent to give light yellow crystal 2.61 g (68% yield). $^1$H NMR (CDCl$_3$) δ (ppm): 0.94 (t, J=6.8 Hz, 6H, CH$_3$), 1.39–1.44 (m, 8H, alkyl), 1.55–1.62 (m, 4H, alkyl), 1.92–2.01 (m, 4H, alkyl), 4.10 (t, J=6.6 Hz, 4H, OCH$_2$), 4.73 (s, benzylic, 4H), 7.49 (d, J=8.7 Hz, 2H, naphthyl), 7.84 (d, J=8.7 Hz, 2H, naphthyl). M.p. 58–60° C.

Example 22

Synthesis of 1,5-bis(hexyloxy)-2,6-bis (methylenediethylphosphate)naphthalene (compound 22)

Dibromo compound 21 (2.50 g, 4.9 nmmol) and triethyl phosphite (2 mL, 12 mmol) were mixed and heated at 100° C. for 4 h. The crude product was recrystallized from bexane to give white crystals and the mother liquor was purified by column chromatography on silica gel using 20:80 acetone-:hexane as an eluent. Total yield 2.34 g (76% yield). $^1$H NMR (CDCl$_3$) δ (ppm): 0.94 (t, J=6.8 Hz, 6H, CH$_3$), 1.26 (t, J=7.1 Hz, 12H, CH$_3$), 1.38–1.43 (m, 8H, alkyl), 1.53–1.63 (m, 4H, alkyl), 1.88–1.98 (m, 4H, alkyl), 3.39 (d, J=21.7 Hz, 4H, OCH$_2$), 3.99–4.12 (m, 8H, POCH2), 7.55 (d, J=8.8 Hz, 2H, naphthyl), 7.79 (d, J=8.8 Hz, 2H, naphthyl); $^3$C NMR (CDCl$_3$): 13.98, 16.28, 16.35, 22.59, 25.77, 26.14, 27.99, 30.40, 31.72, 61.97, 62.06, 75.09, 118.14, 120.62, 120.72, 128.30, 128.30, 129.12, 153.51, 153.53, 153.64; M.p. 48–50° C.; FD-MS: m/z 628 (M$^+$).

Example 23

Synthesis of 9,9'-dihexylfluorene (compound 23)

Fluorene (23.0 g, 0.14 mol) was dissolved in 200 mL of anhydrous THF and cooled to –78° C. To this solution was added slowly n-BuLi (2.5 M in hexane, 65 mL, 0.16 mol) and the red solution was stirred at low temperature for an hour. n-Hexyl bromide (27.4 g, 0.17 mol) dissolved in 20 mL of THF was added to the above solution. The reaction was stirred at low temperature for 2 hours and n-BuLi (2.5 M in hexane, 65 mL, 0.16 mol) was added again and the reaction was stirred for an hour. After that, n-hexyl bromide (27.4 g, 0.17 mol) was added and the reaction was left stirring overnight. The green reaction was quenched with water, and the yellow solution was extracted with ether. The combined organic phase was dried over MgSO$_4$. The crude product was purified by vacuum distillation to yield pure product 42.3 g (93% yield) as clear viscous oil. $^1$H NMR (CDCl$_3$) δ (ppm): 0.57–0.66 (m, 4H), 0.75 (t, J=6.7 Hz, 6H), 0.86–0.90 (m, 4H), 1.02–1.11 (m, 8H), 1.91–1.97 (m, 4H), 7.28–7.34 (m, 6H), 7.67–7.69 (m, 2H); $^{13}$C NMR (CDCl$_3$): 13.97, 22.57, 23.74, 29.73, 31.50, 40.42, 55.02, 119.62, 122.83, 126.67, 126.96, 141.13, 150.69.

Example 24

Synthesis of 2,7-bisbromomethyl)-9,9'-di(hexyl) fluorene (compound 24)

Compound 23 (15.0 g, 0.045 mol) and paraformaldehyde (13.5 g, 0.45 mol) were dissolved in 90 mL of 30% HBr in acetic acid. The reaction was stirred at 70° C. overnight. The mixture was poured into 200 mL of water and extracted with methylene chloride. The crude product was purified by column chromatography on silica gel using hexane as an eluent to yield 11.2 g of pale yellow viscous oil. $^1$H NMR (CDCl$_3$) δ (ppm): 0.58–0.65 (m, 4H), 0.75 (t, J=6.7 Hz, 6H), 1.03–1.11 (m, 12H), 1.92–1.98 (m, 4H), 4.57 (s, 4H), 7.32–7.35 (m, 4H), 7.61 (d, J=7.7 Hz, 2H); $^{13}$C NMR (CDCl$_3$): 13.96, 22.45, 23.65, 29.51, 31.34, 34.32, 40.07, 55.14, 120.02, 123.66, 127.98, 136.91, 140.74, 151.66.

Example 25

Synthesis of 2,7-bis(cyanomethyl)-9,9'-di(hexyl) fluorene (compound 25)

Compound 24 (6.85 g, 0.013 mol) was dissolved in 50 mL of acetonitrile. To this solution was added potassium carbonate (4.55 g, 0.033 mol), dimethylcyano hydrine (3.0 mL, 0.033 mol), and 0.15 g of crown-18-6. The reaction was stirred at room temperature overnight. The reaction was diluted with water, and extracted with ether. The crude product was purified by column chromatography on silica gel using 10:90 ethyl acetate:hexane as an eluent to yield pure product as white crystals 2.8 g (51% yield). $^1$H NMR (CDCl$_3$) δ (ppm): 0.58–0.65 (m, 4H), 0.75 (t, J=6.7 Hz, 6H), 1.05–1.15 (m, 12H), 1.93–1.99 (m, 4H), 3.84 (s, 4H), 7.28–7.32 (m, 4H), 7.68 (d, J=7.7 Hz, 2H); $^{13}$C NMR (CDCl$_3$): 13.96, 22.54, 23.73, 23.91, 29.58, 31.46, 40.23, 55.46, 120.43, 122.42, 126.81, 128.93, 140.32, 151.97; M.p. 70–72° C.; FD-MS: m/z 412 (M$^+$).

Example 26

Synthesis of 3-(2-ethylhexyl)thiophene (compound 26)

Dry magnesium turnings (10.2 g, 0.42 mol) and 40 mL of anhydrous THF were placed in a three-necked round-bottomed flask. A crystal of iodine was added to initiate the Grignard reaction. 2-Ethylhexyl bromide (79.0 g, 0.41 mol) in 100 mL of anhydrous THF was then added dropwise to magnesium turnings. After the addition, the reaction was heated to reflux for 1 h, then cooled down to room temperature, and diluted with 100 mL of THF. In another flask were added 3-bromothiophene (50.0 g, 0.31 mol), [1,3-bis(diphenylphosphino)propane]dichloronickel (1.7 g, 0.003 mol), and 100 mL of THF and the flask was cooled in an ice-bath. The Grignard reagent was added to the above solution via a cannula. After stirring at room temperature overnight, the reaction was quenched with 2N HCl, extracted with ethyl ether. The combined organic phase was washed with brine and dried over MgSO$_4$. The crude product was purified by column chromatography on silica gel using hexane as an eluent to give 27.5 g pure product as light yellow liquid (46% yield). $^1$H NMR (CDCl$_3$) δ (ppm): 0.84–0.89 (m, 6H), 1.19–1.33 (m, 8H), 1.53–1.57 (m, 1H), 2.56 (d, J=6.8 Hz, 2H), 6.87–6.90 (m, 2H), 7.19–7.23 (m, 2H); $^{13}$C NMR (CDCl$_3$): 10.86, 14.12, 23.05, 25.70, 28.95, 32.58, 0.34, 40.46, 120.64, 124.79, 128.80, 141.93; FD-MS: m/z 196 (M$^+$).

Example 27

Synthesis of 2,5-bis(bromomethyl)-3-(2-ethylhexyl) thiophene (compound 27)

Compound 26 (7.0 g, 0.036 mol) and paraformaldehyde (2.57 g, 0.086 mol) were dissolved in 3 mL of acetic acid and HBr solution (30% in acetic acid, 0.088 mol, 18 mL). The reaction was stirred at room temperature under nitrogen overnight. The reaction was diluted with 200 mL of ethyl ether, washed with water, saturated NaHCO$_3$ solution and brine. After the solvent was removed, 9.6 g of light brown oil was obtained (70% yield) which was almost pure and used for next step reaction with further purification. $^1$H NMR (CDCl$_3$) δ (ppm): 0.84–0.91 (m, 6H), 1.19–1.33 (m, 8H), 1.53–1.61 (m, 1H), 2.45 (d, J=7.2 Hz, 2H), 4.63 (s, 4H), 6.81 (s, 1H); $^{13}$C NMR (CDCl$_3$): 10.89, 14.09, 23.01, 25.33, 25.89, 26.66, 28.90, 32.73, 40.25, 130.49, 135.51, 140.00, 141.96; FD-MS: m/z 380 (M$^+$).

Example 28

Synthesis of 2,5-bis(methylenediethylphosphate)-3-(2-ethylhexyl)thiophene (compound 23)

Compound 27 (9.6 g, 0.025 mol) and triethyl phosphite (10.8 mL, 0.063 mol) were placed in a 100-mL round-bottomed flask and heated to 100° C. for 4 hours. The crude product was purified by column chromatography on silica gel using 25:75 acetone:hexane as an eluent to give 9.0 g of light yellow oil (72% yield). $^1$H NMR (CDCl$_3$) δ (ppm): 0.82–0.89 (m, 6H), 1.25–1.31 (m, 20H), 1.47–1.55 (m, 1H), 2.42 (d, J=7.1 Hz, 2H), 3.19–3.29 (m, 4H), 4.01–4.11 (m, 8H), 6.70 (s, 1H); $^{13}$C NMR (CDCl$_3$): 10.90, 14.10, 16.38, 16.45, 16.46, 23.08, 25.70, 28.98, 32.66, 32.69, 32.70, 40.48, 40.48, 125.63, 129.37, 129.47, 139.91; FD-MS: m/z 496 (M$^+$).

Synthesis of Polymers

Example 29

General Procedure for a Horner-Emmons Reaction

Equimolar dicarboxyaldehyde and diphosphate monomers were dissolved in anhydrous THF under nitrogen. To this solution was added 2.5 equivalent of NaH. The reaction was stirred at room temperature overnight under nitrogen. Small amount of benzaldehyde was added to endcap phosphate endgroup. The polymer was precipitated into methanol, filtered, re-dissolved in chloroform and precipitated twice from methanol. The resulting polymer was dried under vacuum at 45° C. overnight.

Example 30

General Procedure for a Knoevenagel Reaction

Equimolar dicarboxyaldehyde and dicyano monomers were dissolved in a mixed solvent of 1:1 anhydrous THF and t-butyl alcohol under nitrogen. To this solution was added catalytic amount of potassium t-butoxide. The reaction was stirred at room temperature overnight under nitrogen. The polymer was precipitated into methanol, filtered, re-dissolved in chloroform and precipitated twice from methanol. The resulting polymer was dried under vacuum at 45° C. overnight.

EL Device Fabrication and Performance

Example 31

An EL device satisfying the requirements of the invention was constructed in the following manner. The organic EL medium has single layer of polymer thin film.
 a) An indium-tin-oxide (ITO) coated glass substrate was sequentially ultra-sonicated in a commercial detergent, rinsed with deionized water, degreased in toluene vapor and exposed to ultraviolet light and ozone for a few minutes.
 b) A toluene solution of a polymer (30 mg in 30 mL of solvent) was filtered through a 2 μm Teflon filter. The polymer solution was then spin-coated onto ITO under a controlled spinning speed. The thickness of the polymer film was between 500–700 Angstroms.
 c) On the top of the polymer film was deposited a cathode layer of 2000 Angstroms thick consisting of a 10:1 atomic ratio of Mg and Ag.

The above sequence completed the deposition of the EL device.

The device was then hermetically packaged in a dry glove box for protection against ambient environment.

Figure 4:
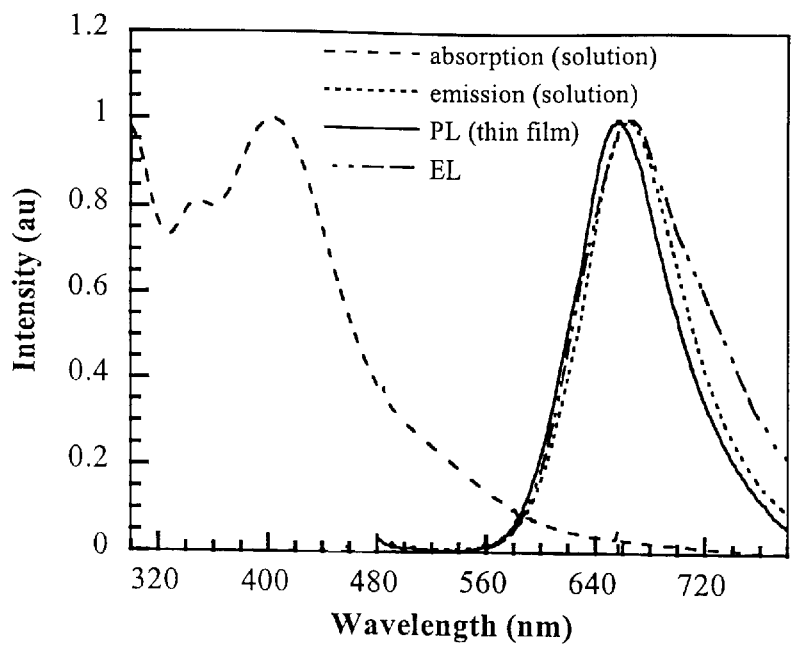
FIG. 4 illustrates the absorption, emission, and photoluminescence spectra of polymer 22 and electroluminescence spectrum of single-layer EL device fabricated from polymer 22.
Figure 5:
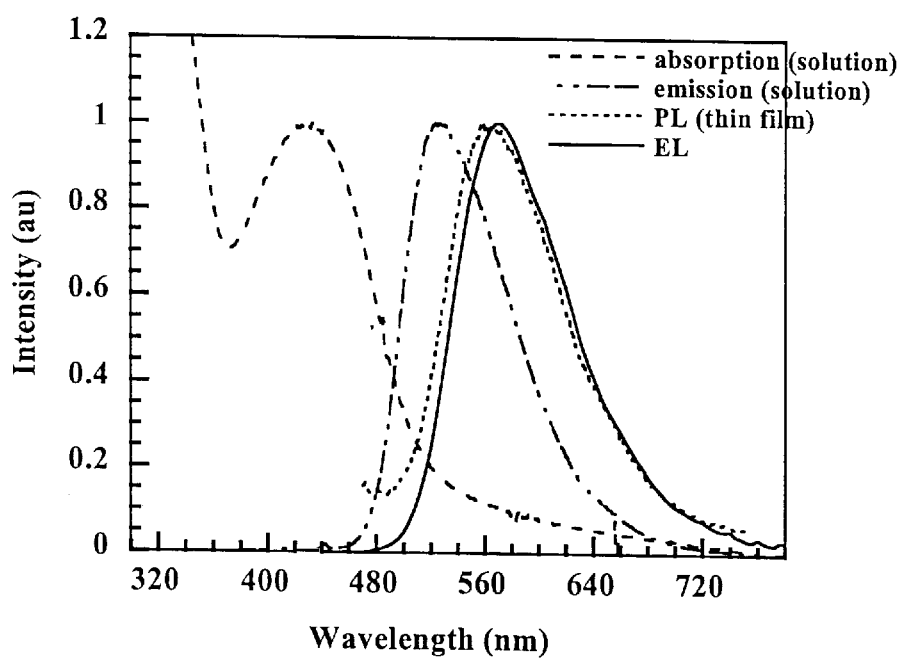
FIG. 5 illustrates the absorption, emission, and photoluminescence spectra of polymer 17 and electroluminescence spectrum of single-layer EL device fabricated from polymer 17.
Figure 6:
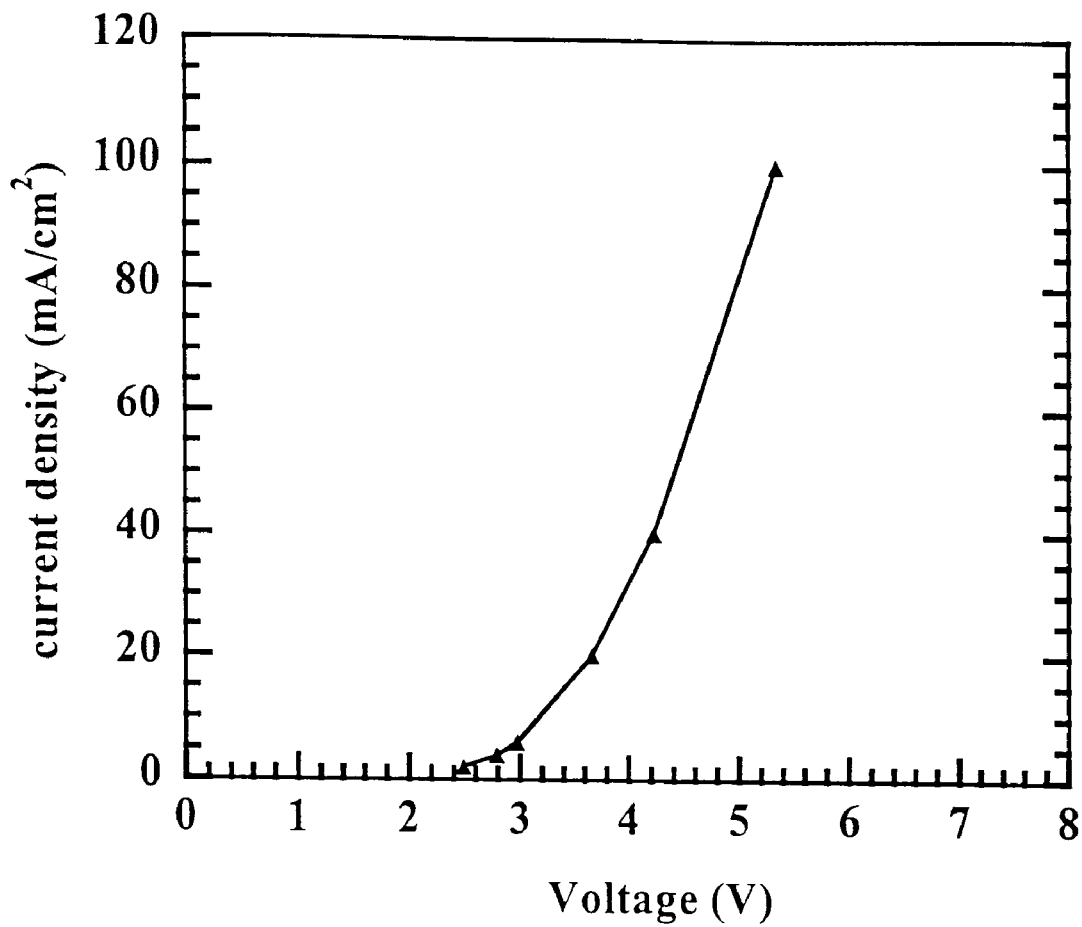
FIG. 6 illustrates the voltage-current density and luminance characteristics of a single-layer EL device fabricated from polymer 22.

Table 1 summarizes the characterization of the polymers prepared in the present invention. The synthesized polymers show high $T_g$ and $T_d$. Absorption and emission spectra were obtained from dilute solutions, photoluminescence (PL) spectra from solid thin films of the polymers, and EL spectra were obtained from ITO/polymer/Mg:Ag EL devices. The fabrication of EL devices was illustrated in example 31. FIGS. 4 and 5 show the absorption, emission, PL and EL spectra of polymers 22 and 17 respectively. The voltage-current characteristics of the EL device of polymer 22 is shown in FIG. 6.

TABLE 1

Characterization of polymers according to Examples.

| Polymer | Mw[a] | $T_g$ (° C.) | $T_d$ (° C.) | Absorption (λmax nm)[b] | Emission (λmax nm)[b] | EL (λmax nm) |
|---|---|---|---|---|---|---|
| 4 | 32000 | 121 | 412 | 509 | 555 | 556 |
| 1 | 67200 | 225 | 448 | 362 | 562 | ND[c] |
| 5 | 34700 | 237 | 454 | 403 | 521 | ND |
| 30 | 2580 | 210 | 420 | 421 | 577 | ND |
| 18 | 204000 | 175 | 390 | 430 | 530 | 572 |
| 22 | 31100 | 149 | 395 | 404 | 664 | 668 |
| 34 | 5710 | 120 | 388 | 515 | 591 | 620 |
| 14 | 2740 | 105 | 290 | 408 | 506 | 572 |
| 9 | 36300 | 123 | 351 | 449 | 543 | ND |
| 17 | 2180 | 79 | 329 | 421 | 527 | 572 |

[a]weight average molecular weight, determined by size exclusion chromatography in trichlorobenzene using polystyrene standard.
[b]measured in solution
[c]not determined.

The invention has been described in detail with particular reference to certain preferred embodiments thereof, but it will be understood that variations and modifications can be effected within the spirit and scope of the invention.

Parts List

10 substrate
20 anode layer
30 hole transport layer
40 electron transport layer
50 EL medium
60 cathode
100 substrate
200 anode
300 hole transport layer
400 emissive layer
500 electron transport layer
600 EL medium
700 cathode
1000 substrate
2000 anode
3000 emitting layer
4000 cathode

What is claimed is:

1. An electroluminescent device which comprises an anode, a cathode, and a polymer luminescent material disposed between the anode and cathode, the polymer luminescent material having an arylamine moiety has the molecular formula:

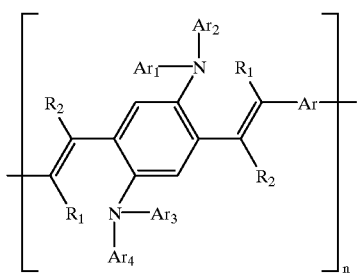

wherein:
 $R_1$ and $R_2$ are independently hydrogen, alkyl group of from 1 to 24 carbon atoms, or aryl or substituted aryl of from 6 to 40 carbon atoms, or heteroaryl or substituted heteroaryl of from 4 to 40 carbons, or a cyano group n is the number of repeating units;
 $Ar_1$, $Ar_2$, $Ar_3$, $Ar_4$, and Ar are each individually aryl or substituted aryl of from 6 to 40 carbon atoms; or a heteroaryl or substituted heteroaryl of from 4 to 40 carbons, or combinations thereof.

2. The electroluminescent device of claim 1 wherein $Ar_1$ and $Ar_2$ are connected by a chemical bond to form a first group and $Ar_3$ and $Ar_4$ are connected by a chemical bond to form a second group.

3. The electroluminescent device of claim 1 wherein $Ar_1$ and $Ar_2$ are connected by a chemical bond to form a first group and $Ar_3$ and $Ar_4$ are connected by a chemical bond to form a second group and wherein the first and second groups are respectively given by the following formulas:

and

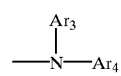

each be one of the following carbazole and carbazole derivalives:

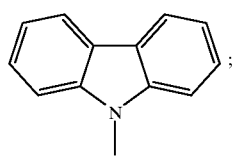

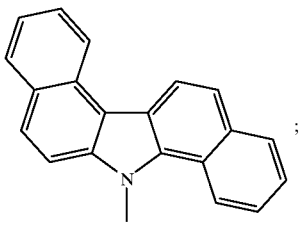

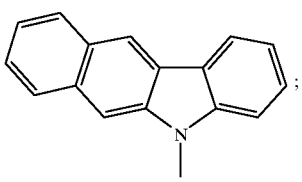

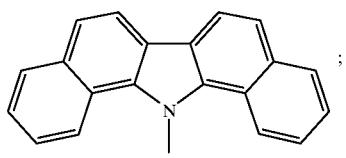

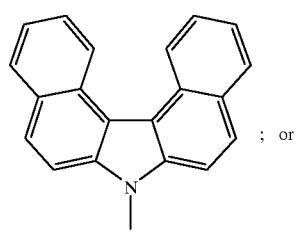

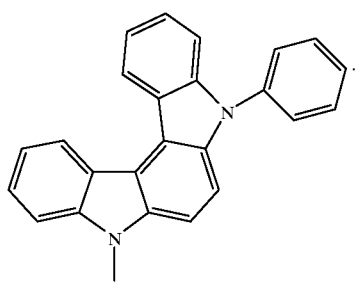

4. The electroluminescent device of claim 1 wherein Ar includes more than one Ar group.

5. The electroluminescent device of claim 1 wherein Ar is selected from the following formulas and wherein R in each formula is a substituent selected from hydrogen, alkyl group of from 1 to 24 carbon atoms, aryl or substituted aryl of from 6 to 28 carbon atoms, heteroaryl or substituted heteroaryl of from 4 to 40 carbons, a cyano group, a nitro group, a chlorine, bromine, or a fluorine atom; and m is an integer from 1 to 3

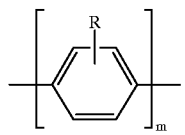

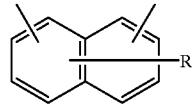

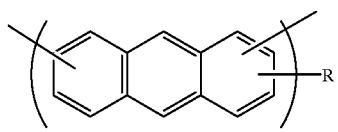

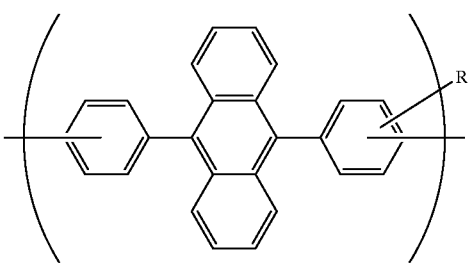

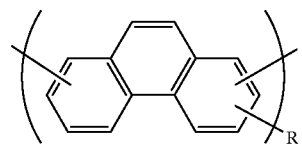

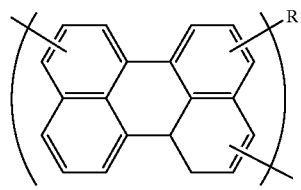

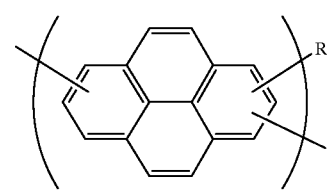

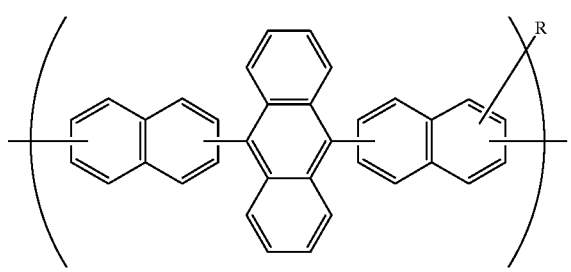

-continued

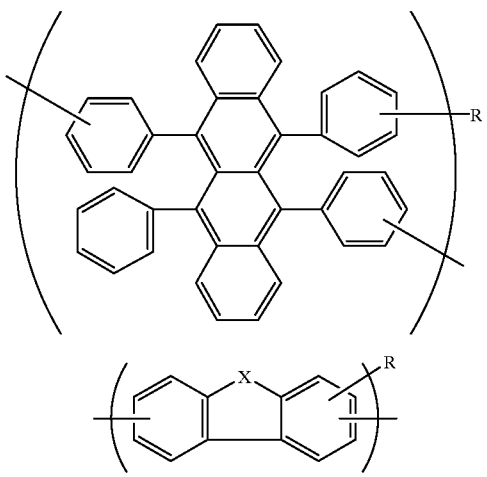

wherein: X is an O or S atom;

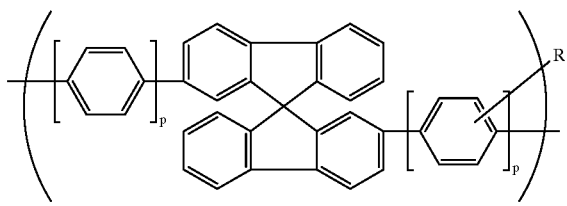

wherein: p is an integer from 0 to 2;

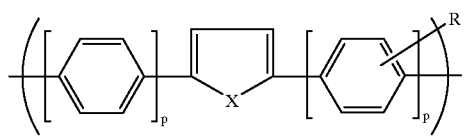

wherein: X is an O or S atom, and p is an integer from 0 to 2;

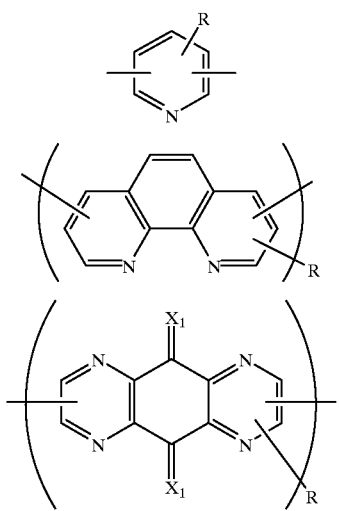

wherein: $X_1$ is an O atom or a cyano group;

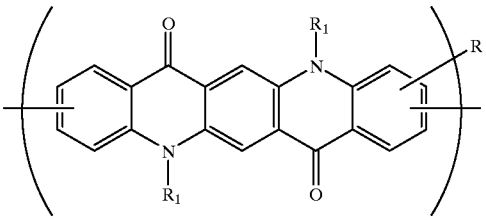

wherein: $R_1$ is a substituent, selected from hydrogen, alkyl group of from 1 to 24 carbon atoms, aryl or substituted aryl of from 6 to 28 carbon atoms, heteroaryl or substituted heteroaryl of from 4 to 40 carbons;

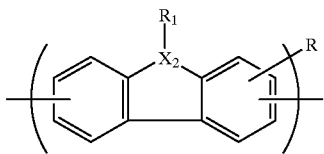

wherein: $R_1$ is defined as above, and $X_2$ is a nitrogen or carbon atom;

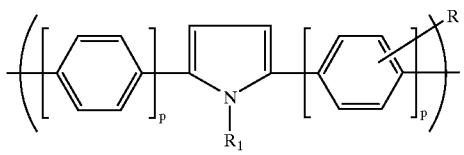

wherein: $R_1$ is defined as above, and p is an integer from 0 to 2.

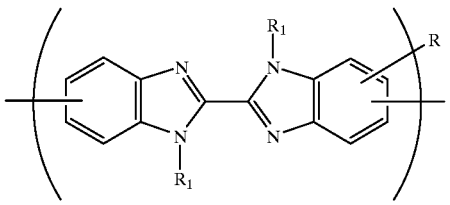

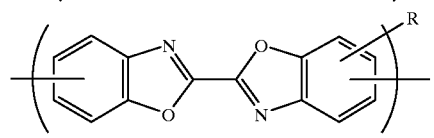

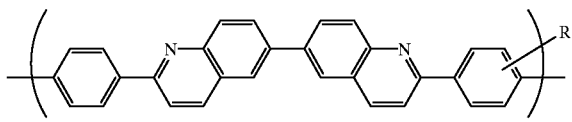

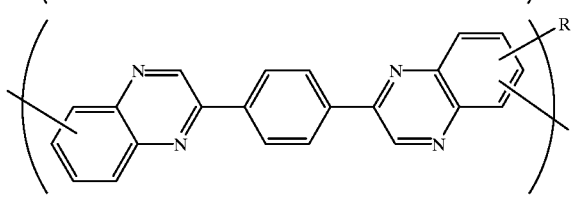

-continued

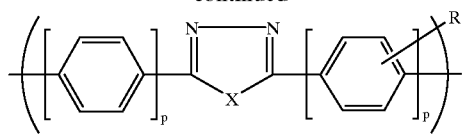

wherein: X is an O or S atom, p is an integer from 0 to 2;

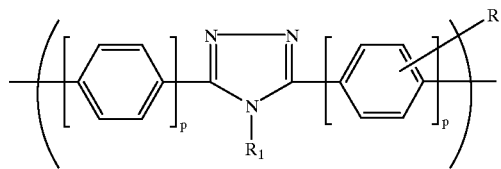

wherein: $R_1$ is defined as above, and p is an integer from 0 to 2.

6. An electroluminescent device which comprises an anode, a cathode, and a polymer luminescent material disposed between the anode and cathode, the polymer luminescent material being doped with one or more fluorescent dyes or other light emitting materials, the polymer luminescent material including an arylamine moiety has the molecular formula:

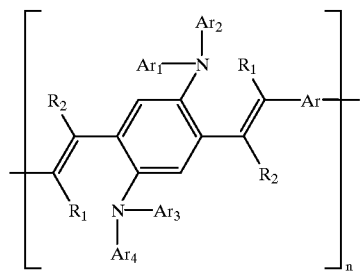

wherein:

$R_1$ and $R_2$ are independently hydrogen, alkyl group of from 1 to 24 carbon atoms, or aryl or substituted aryl of from 6 to 40 carbon atoms, or heteroaryl or substituted heteroaryl of from 4 to 40 carbons, or a cyano group;

$Ar_1$, $Ar_2$, $Ar_3$, $Ar_4$, and Ar are each individually aryl or substituted aryl of from 6 to 40 carbon atoms; or a heteroaryl or substituted heteroaryl of from 4 to 40 carbons, or combinations thereof.

* * * * *